US011878540B2

(12) United States Patent
Sievers et al.

(10) Patent No.: US 11,878,540 B2
(45) Date of Patent: *Jan. 23, 2024

(54) FLEXOGRAPHIC PRINTING PLATE WITH PERSISTENT MARKINGS

(71) Applicant: Esko-Graphics Imaging GmbH, Itzehoe (DE)

(72) Inventors: Wolfgang Sievers, Kremperheide (DE); Pascal Thomas, Hamburg (DE); Thomas Klein, Wolfenbuettel (DE)

(73) Assignee: Esko-Graphics Imaging GmbH, Itzehoe (DE)

(*) Notice: Subject to any disclaimer, the term of this patent is extended or adjusted under 35 U.S.C. 154(b) by 24 days.

This patent is subject to a terminal disclaimer.

(21) Appl. No.: 17/900,131

(22) Filed: Aug. 31, 2022

(65) Prior Publication Data

US 2023/0001724 A1 Jan. 5, 2023

Related U.S. Application Data

(60) Division of application No. 16/433,873, filed on Jun. 6, 2019, which is a continuation-in-part of application No. PCT/EP2019/052536, filed on Feb. 1, 2019.

(Continued)

(51) Int. Cl.
*B41N 1/12* (2006.01)
*B41M 1/04* (2006.01)
(Continued)

(52) U.S. Cl.
CPC ............... *B41M 1/04* (2013.01); *B41C 1/00* (2013.01); *B41F 13/12* (2013.01); *B41M 3/14* (2013.01);
(Continued)

(58) Field of Classification Search
None
See application file for complete search history.

(56) References Cited

U.S. PATENT DOCUMENTS 4,872,407 A 10/1989 Banke
4,927,723 A 5/1990 Cusdia
(Continued)

FOREIGN PATENT DOCUMENTS

CN 1920663 A 2/2007
CN 200984850 Y 12/2007
(Continued)

OTHER PUBLICATIONS

Japanese Notice of Reasons for Refusal for Japanese Application No. 2021503199, dated Sep. 20, 2022 with translation, 13 pages.
(Continued)

*Primary Examiner* — Joshua D Zimmerman
(74) *Attorney, Agent, or Firm* — RatnerPrestia

(57) ABSTRACT

A finished flexo plate with printing dots and non-printing indicia. The printing dots have an elevation above the plate floor sufficient to transfer ink to a substrate in a printing step, whereas the non-printing indicia are configured for persistent readability relative to the plate floor but have a height relative to the plate floor insufficient to transfer ink to the substrate in the printing step. The non-printing indicia define a pattern of alphanumeric characters, non-text graphics, or a combination thereof, and are disposed on the plate floor in the form of areas of presence and absence of polymer defined by structures formed of microdots, each microdot having an elevation relative to the plate floor lower than a printing height.

21 Claims, 10 Drawing Sheets

Related U.S. Application Data

(60) Provisional application No. 62/653,972, filed on Apr. 6, 2018.

(51) Int. Cl.
  *B41F 13/12* (2006.01)
  *B41M 3/14* (2006.01)
  *B41C 1/00* (2006.01)
  *G06K 1/12* (2006.01)
  *G06K 7/14* (2006.01)

(52) U.S. Cl.
  CPC .............. *B41N 1/12* (2013.01); *G06K 1/121* (2013.01); *G06K 7/1413* (2013.01); *B41P 2200/12* (2013.01)

(56) References Cited

U.S. PATENT DOCUMENTS

| | | |
|---|---|---|
| 6,786,153 B2 | 9/2004 | Burrow et al. |
| 7,126,724 B2 | 10/2006 | McCrea et al. |
| 7,300,728 B2 | 11/2007 | Manness |
| 7,717,040 B2 | 5/2010 | Shishkin |
| 7,810,731 B2 | 10/2010 | Johnson et al. |
| 7,908,967 B2 | 3/2011 | Kwon et al. |
| 8,468,941 B2 | 6/2013 | Hackler et al. |
| 8,757,479 B2 | 6/2014 | Clark et al. |
| 9,016,199 B2 | 4/2015 | Ramakrishnan |
| 9,375,916 B2 | 6/2016 | Thomas et al. |
| 9,671,695 B2 | 6/2017 | Fronczkiewicz et al. |
| 10,175,580 B2 | 1/2019 | Fronczkiewicz et al. |
| 10,518,524 B2 | 12/2019 | Tashiro |
| 10,919,330 B2 | 2/2021 | Wattyn |
| 2002/0120493 A1 | 8/2002 | Mormile |
| 2005/0157347 A1 | 7/2005 | Dewitte |
| 2007/0084368 A1 | 4/2007 | Vest et al. |
| 2009/0195837 A1 | 8/2009 | Dardikman et al. |
| 2010/0028815 A1 | 2/2010 | Zwadlo |
| 2010/0060909 A1 | 3/2010 | Conescu et al. |
| 2011/0079161 A1 | 4/2011 | Amsili et al. |
| 2011/0189600 A1 | 8/2011 | Plumer et al. |
| 2011/0209635 A1 | 9/2011 | Claes et al. |
| 2011/0308411 A1 | 12/2011 | Thomas et al. |
| 2012/0003588 A1 | 1/2012 | Choi et al. |
| 2012/0048133 A1 | 3/2012 | Burberry et al. |
| 2013/0056542 A1 | 3/2013 | Gnutzmann et al. |
| 2014/0076184 A1 | 3/2014 | Anderson, III |
| 2014/0166761 A1 | 6/2014 | Todeschini et al. |
| 2014/0326152 A1 | 11/2014 | Gartner et al. |
| 2015/0097889 A1 | 4/2015 | Maneira |
| 2015/0217558 A1 | 8/2015 | Bielak |
| 2018/0035614 A1 | 2/2018 | Davis et al. |
| 2018/0210345 A1 | 7/2018 | Wolterink et al. |
| 2020/0016916 A1 | 1/2020 | Sievers et al. |
| 2021/0187934 A1 | 6/2021 | Muehlfeit et al. |
| 2021/0245542 A1 | 8/2021 | Kaufmann et al. |

FOREIGN PATENT DOCUMENTS

| | | |
|---|---|---|
| CN | 101283314 A | 10/2008 |
| CN | 103959435 A | 7/2014 |
| CN | 105531628 A | 4/2016 |
| CN | 107278278 A | 10/2017 |
| CN | 108463352 A | 8/2018 |
| DE | 102018115146 A1 | 12/2019 |
| EP | 0169294 A2 | 1/1986 |
| EP | 1531014 A2 | 5/2005 |
| EP | 1557279 A2 | 7/2005 |
| EP | 2397327 A2 | 12/2011 |
| EP | 2428360 A1 | 3/2012 |
| EP | 2722713 A2 | 4/2014 |
| FR | 3085304 A1 | 3/2020 |
| JP | 2000181051 A | 6/2000 |
| JP | 2002223095 A | 8/2002 |
| JP | 2004038144 A | 2/2004 |
| JP | 2005326722 A | 11/2005 |
| JP | 2006048053 A | 2/2006 |
| JP | 2010528905 A | 8/2010 |
| JP | 2013507269 A | 3/2013 |
| JP | 2017161885 A | 9/2017 |
| WO | 9842510 A2 | 10/1998 |
| WO | 2010014156 A1 | 2/2010 |
| WO | 2016132828 A1 | 8/2016 |
| WO | 2017072588 A2 | 5/2017 |
| WO | 2019110809 A1 | 6/2019 |
| WO | 2019192764 A1 | 10/2019 |
| WO | 2020221684 A1 | 11/2020 |

OTHER PUBLICATIONS

Invitation to Pay Additional Fees and Partial Search Report for International Application No. PCT/EP2021/082848, dated Mar. 21, 2022, 15 pages.
Chinese Office Action for Chinese Application No. 201980038697.2, dated Mar. 14, 2022 with translation, 15 pages.
Guo et al., "Image Relief Algorithm and Its Application in Security Printing," Feb. 5, 2011, vol. 3(1), China Printing and Packaging Study.
Xu, S., "A Few Questions about Flexographic Printing Technology," 2 pages, China Packaging Industry.
International Preliminary Report on Patentability and Written Opinion for International Application No. PCT/EP2020/078112, dated Apr. 12, 2022, 12 pages.
European Communication pursuant to Article 94(3) for European Application No. 19 780 253.1, dated Apr. 28, 2022, 6 pages.
Non Final Office Action for U.S. Appl. No. 17/045,253, dated Mar. 21, 2022, 21 pages.
Non Final Office Action for U.S. Appl. No. 17/056,584, dated Jun. 10, 2021, 13 pages.
International Search Report and Written Opinion for International Application No. PCT/EP/2019/076922, dated Jan. 7, 2020, 15 pages.
International Search Report and Written Opinion for International Application No. PCT/EP2019/052536, dated Jun. 18, 2019, 12 pages.
U.S. Appl. No. 62/839,171, filed Apr. 26, 2019, 32 pages.
International Application No. PCT/EP2019/073200, dated Aug. 30, 2019, 27 pages.
International Preliminary Report on Patentability and Written Opinion for International Application No. PCT/EP2019/052536, dated Oct. 6, 2020, 10 pages.
International Search Report and Written Opinion for International Application No. PCT/EP2020/078112, dated Jan. 29, 2021, 18 pages.
International Search Report and Written Opinion for International Application No. PCT/EP2019/073200, dated Nov. 15, 2019, 9 pages.
Non Final Office Action for U.S. Appl. No. 16/433,873, dated Jun. 9, 2021, 28 pages.
Non Final Office Action for U.S. Appl. No. 17/045,253, dated Aug. 1, 2022, 30 pages.
Extended European Search Report for European Application No. 22195757.4, dated Dec. 22, 2022, 10 pages.
Extended European Search Report for European Application No. 22172781.1, dated Nov. 23, 2022, 11 pages.

FLEXOGRAPHIC PRINTING PLATE WITH PERSISTENT MARKINGS

This application is a division of U.S. application Ser. No. 16/433,873 (status: allowed), filed 6 Jun. 2019, which is a continuation-in-part of PCT application Ser. No. PCT/EP19/052536, filed 1 Feb. 2019, which claims priority to U.S. Provisional Patent Application No. 62/653,972, filed 6 Apr. 2018, both titled "METHOD FOR PERSISTENT MARKING OF FLEXO PLATES WITH WORKFLOW INFORMATION AND PLATES MARKED THEREWITH," the contents of all of which are incorporated herein by reference in their entirety for all purposes.

BACKGROUND OF THE INVENTION

Most contemporary raster image processing (RIP) software, such as, for example, the RIP available with ESKO Automation Engine software, sold by Esko Software BVBA of Ghent, Belgium, allows creation of Barcodes or QR-codes, which can be added to the image information on a flexographic printing plate. However, the possibilities of this feature are typically not fully utilized.

A typical flexo plate workflow may comprise the following steps:
1. Processing image information, using a raster image processor, at a certain screen resolution to obtain an image file.
2. Using the processor, combining the image file with other image files to create an imaging job that covers a full polymer plate format.
3. Imaging the image files onto a Laser Ablation Mask (LAM) layer on top of a photopolymer plate, by any of various methods known in the art, thereby creating a mask on top of the plate.
4. Curing the rear side of the plate, such as with UVA light, to build a floor of polymer.
5. Curing the photopolymer through the mask on top of the plate, such as with UVA light.
6. Processing the plate to remove non-cured polymer from the plate.
7. Optionally, drying the plate to remove solvent (typically not performed when the processing is done by a thermal process).
8. Finishing the plate, such as by applying UVA and UVC light.
9. Separating the different image files, such as by cutting the polymer plate into patches on a xy-cutting table.
10. Mounting one or more of the plate patches, each of which embodies one or more image files, to a printing press, such as on a printing press cylinder.
11. Printing physical images on a print-receiving substrate using the plate in a printing press.
12. Cleaning ink from the plate, removing the plate from the press, and storing it for future use, such as a reprinting job.

The process steps between image RIPping and printing the physical image may be executed in a sequence that is not directly temporal. Some of the consecutive steps may be delayed by a transport process. For example, between the steps of separating the images on the xy-cutting table and mounting them on a printing cylinder, the plate patches may be shipped from a plate manufacturer to a printing facility.

Despite recent advances in automation for plate making, only some process steps may be suitable for combination in an automated manner into consecutive steps. Hence, many steps may still be executed independently from the others.

As many plate makers have two or more production rows and the equipment for the different production rows may not be identical, two plates having identical images may run through different equipment when processed in parallel.

Consequently, the use of workflow markings, if used at all, is typically limited to only general information, because attaching equipment-specific parameters to a plate that may be processed on different devices with different parameter settings may not be efficient or useful. Accordingly, parameters are typically set for different process steps manually. Consequently, human errors may cause a certain percentage of failure, resulting in plate loss, rework, and loss of money.

Thus, while it may be known to include some kind of markings on a printing plate, typical prior art markings only contain information used for recognizing the plate in a later process step such as for example, information identifying the Job and Customer name. Plate markings may also be used to identify the type of the plate.

One limitation of prior art marking methods for flexo plates is that they typically only contain a small amount of information that does not support the entire plate workflow. Frequently, the marks are removed during processing of the plate at a certain point in the workflow, requiring downstream operators to look up plate-processing parameters and manually key them in to the user interfaces of various processing equipment.

Thus, there is a need in the art to eliminate the problem of incomplete and lost information during the passage of a flexographic printing plate through the plate making workflow, thus improving the central control of the plate workflow and helping to avoid operator mistakes, time loss and money loss.

SUMMARY OF THE INVENTION

Exemplary embodiments of the invention include a system for making a flexo plate. Exemplary systems comprise a plurality of processing machines, each processing machine configured to perform one or more process steps in a workflow, including at least an imaging step, a curing step, a washing or other non-cured-polymer-removal step, a printing step, and optionally, a cutting step, a storage step, or a combination thereof, each processing machine having a controller and at least one variable operating parameter controlled by the controller. The system includes means for providing machine-readable indicia on the flexo plate. The machine-readable indicia is configured for persistent readability downstream of the washing (and cutting, where present) steps without printing in the printing step. The machine-readable indicia may embody information including at least a plate identifier and instructions corresponding to the at least one variable operating parameter for each of the processing machines or information corresponding to an address in computer storage where the information resides.

The means for providing the indicia may comprise a computer programmed with instructions for embedding information into a code, such as a 2-dimensional code such as a QR code, a barcode, or any machine readable code known in the art, as well as a computer programmed with instructions for providing information formatted for embedding into a magnetic stripe or into a chip, such as an RFID chip, capable of being read by any reader known in the art. The means for providing the code may further comprise a printer for printing a 2-D code, an imager for embedding the code into a printing plate such that the code will be readable after plate processing, as well as after the full set of plate processing steps to which that plate is configured to be processed. The means for providing an RFID code comprises machines for writing information onto an RFID-readable chip and machines for writing information into a magnetic stripe, as are known in the art, along with any of the processing equipment known in the art required for fabricating an RFID chip and accompanying antenna(s) into a fully functional RFID module or for creating a magnetic stripe and applying the stripe to a surface.

As described herein, the indicia may be disposed in a strip of polymer in the plate. In one embodiment, the indicia may be in a portion of the plate that is later cut off. In some embodiments, the indicia may be disposed on a floor of the plate using areas of presence and absence of polymer in the plate floor, and/or by clusters of microdots arranged according to the code.

A plurality of readers are configured to read the indicia on the flexo plate, including at least one reader in communication with each controller of each processing machine. The reader may comprise a mobile device, such as a mobile phone, a tablet computer, or the like, having a camera and programmed with instructions to capture an image of the code. The mobile device may have instructions stored thereon for converting the image information to the information readable by the controller and/or information displayed on a display and readable by a human operator, or the mobile device may communicate over a network, such as a wireless network, to a central processor that converts the image to the information readable by the controller. The information for instructing the controller may be transmitted to the controller by the mobile device directly upon conversion of the image information to such instructions, or by the central processor to the controller upon receipt of the image from the mobile device, or by the central processor back to the mobile device, and then to the controller. In other systems, the reader may be directly connected to the processing machine and dedicated to that machine. In some embodiments, including for mobile devices or dedicated readers, the reader may be connected to or in communication with the machine via a wired connection or via a local wireless connection, such as via Bluetooth technology.

Exemplary controllers are configured to receive from the reader instructions corresponding to the variable operating parameters stored in or linked to the indicia and to control the processing machine in accordance with that at least one instruction. Such a controller may comprise a computer processor, accompanying media for storage of machine-readable instructions, and accompanying connections to the various portions of the processing machine in the workflow for conducting the process, all of which components are well known in the art. The controller is programmed with instructions for receiving the information from the reader corresponding to the variable operating parameters, and incorporating those parameters into the control instructions provided by the controller to the various portions controlled thereby. It should be understood that the various portions controlled by the controller may be digital or analog devices, and to the extent necessary, the controller, or converters connected thereto, may convert control information from digital to analog and sensed feedback or monitoring from analog to digital formats, or vice versa.

In one embodiment, the workflow comprises a proofer, and the information read from the indicia may include quality information indicative of printing properties associated with the plate.

Preferred embodiments also include a tracking controller for the workflow in communication with each of the plurality of readers. The tracking controller is configured to receive from each of the plurality of readers a communication indicative of time and in-process location of each flexo plate scanned by the reader. The tracking controller is further configured to provide an output indicative of real-time workflow positions of a plurality of in-process flexo plates. This output may be provided to a display screen connected to a central processor running instructions for operating the tracking controller, and may also be provided to the mobile devices operative as readers and/or to displays associated with any computer connected to a network connected to the tracking controller. The tracking controller comprises a processor and instructions, stored on computer readable media, for programming the processor to receive and store information from the plurality of readers and to process that information into a tracking report output.

Aspects of the invention also include flexo plates created using the processes as described herein. Exemplary flexo plates have machine-readable indicia on the flexo plate that is configured for persistent readability downstream of washing (and cutting, when present) steps without printing in a printing step of a plate workflow. The machine-readable indicia embodies information including instructions corresponding to at least one variable operating parameter for each of a plurality of processing machines or embodying information corresponding to an address in computer storage where the instructions reside, as described herein. The indicia may comprise, for example, a 2-dimensional code, such as a QR-code or a bar code, or an RFID module or a magnetic stripe. As described herein, the indicia may be disposed in a strip of polymer in the plate and/or may be disposed on a floor of the plate using areas of presence and absence of polymer in the plate floor, such as may be created by the use of clusters of microdots arranged in the LAMS layer so as to produce structures that rise above the floor slightly but not a printing level. And, as described herein, a first rendering of the indicia may be located in a first location on the plate and a second rendering of the indicia may be located on a second location on the plate, particularly wherein the first location is in a portion of the plate configured to be cut away from the plate and the second location is in a floor of the plate in an imaged area of the plate.

Other aspects of the invention include computer readable media comprising non-transitory instructions readable by a machine, the instructions embodying any of the method and process steps as described herein. Such instructions may include instructions for coordinating a process for making a flexo plate having a plurality of process steps, including, for example, at least an imaging step, a curing step, a washing step, and a printing step, each step performed by a processing machine having at least one variable operating parameter. The machine readable instructions may include instructions for providing machine-readable indicia on the flexo plate, including embodying in the indicia information including at least a plate identifier and instructions corresponding to the at least one variable operating parameter for each of the processing machines. The foregoing would be embodied in, for example, software, digital storage media embodying the instructions, and machines programmed with the software and firmware, for creating the indicia on the plates.

The machine-readable instructions may also comprise software, and machines programmed with such software, for the tracking controller. Such instructions may include instructions for providing machine-readable indicia on the flexo plate, including embodying in the indicia information corresponding to an address in computer storage. The instructions may also include instructions for storing, in the computer storage in a location identified by the address, information including at least one variable operating parameter for each of the processing machines. The program may also include instructions for receiving a communication from a reader of the indicia, and instructions for transmitting variable operating parameters to a corresponding one of the processing machines. Such a system may further include instructions for implementing a tracking controller for the workflow, the tracking controller in communication with each of the readers associated with each of the processing machines, and configured to receive communications from a plurality of readers configured to read the indicia from a plurality of in-process flexo plates in the workflow, wherein the indicia also includes a plate identifier. The communications received from the reader include locations of the in-process flexo plates. The programmed instructions further include instructions for providing real-time tracking of a workflow position for each of the plurality of in-process flexo plates based upon the communications and instructions for providing the tracking information as an output.

Still another aspect of the invention include flexo plate processing machines capable of performing at least one plate processing step in a plate processing workflow, the machines include a controller configured to receive a communication of one or more variable parameters for controlling the plate processing machine from a reader as described herein. The reader is in communication with the controller configured to read machine-readable indicia on a flexo plate to be processed, the indicia having embodied therein at least instructions corresponding to the variable operating parameters or information corresponding to an address corresponding to a location in computer storage where said instructions reside. The reader is configured to read the instructions embodied in the indicia or at the address corresponding to the information embodied in the indicia, and send the communication to the controller with the at least one variable operating parameter after obtaining the at least one variable operating parameter from reading the indicia or from querying the computer storage address corresponding to the information embodied in the indicia. The controller is also configured to control the processing machine based at least in part upon at least one variable operating parameter received from the reader.

Yet another aspect of the invention includes readers for use in the systems and processes for making a flexo plate as described herein. Such readers may have at least one detector configured to read the indicia from the flexo plate, such as a camera for reading a 2-D code, an RFID receiver and transmitter, or transceiver, for sending an RF signal and receiving an RFID response transmission from an RFID, or a magnetic stripe reader. A communication link in the reader is in communication with at least a controller of at least one processing machine configured to perform at least one of the process steps and a central processor configured to monitor the workflow. The reader also may have a processor configured to process the information read from the indicia, to communicate to the controller of the at least one processing machine the at least one variable operating parameter embodied in the indicia or stored at the address corresponding to information embodied in the indicia, and to communicate to the central processor information regarding the flexo plate read by the reader and a location of the reader within the workflow. The communication to the controller may be direct communication, or a communication that includes intermediate communications between the reader and a central computer. In particular, when the indicia represents an address on a network, the reader may be capable of reading the address, linking to the address, downloading the information from the address, and communicating the information to the processing machine. The communication to the processing machine may be by any wired or wireless communication method known in the art, including but not limited to those expressly described herein.

In some embodiments, the processes, systems, computer program products as described herein may be configured to produce plates in which non-printing indicia is disposed on a floor of the plate as a presence or absence of polymer using microdots. One process may comprise imaging the microdots during a LAMS layer imaging step. The microdots on the resulting plate may comprise a repeating pattern of alphanumeric characters, non-text graphics, or a combination thereof readable by a human and/or machine. The repeating pattern may include alphanumeric characters embodying information including job number, separation color, version, date, or a combination thereof. In one embodiment, the non-printing indicia comprises branding information. In another embodiment, at least a portion of the non-printing indicia may be derived from at least two different types of microdots, such as a combination that creates visible indicia only in the presence of a difference in growth during curing between one of the types as compared to another of the types during processing of the plate. The difference in growth may result from suboptimal processing conditions with respect to at least one processing parameter, such as optical focus or cleanness, floor thickness, actinic radiation exposure parameters, or type of manufacturing equipment.

In another embodiment, the non-printing indicia is used for creating a line for use in alignment of the plate, such as a line positioned on the plate to align parallel to the intended running direction of the printing plate in the press.

In one embodiment, imaging information for the non-printing indicia may be stored in a layer of a PDF file. In another embodiment, image information for the non-printing indicia is combined with printing image information by combining two 1-bit image files. The combination of image information for the non-printing indicia may be combined with printing image information in a Raster Image Processor.

In some embodiments, the processes, systems, computer readable instructions and resulting plates created thereby, as described herein, may relate to providing the non-printing indicia in the form of one or more elevations having a plate thickness above a predefined floor height, wherein the microdots corresponding to the non-printing indicia define the one or more elevations. In other embodiments, the non-printing indicia is provided in the form of one or more depressions having a plate thickness below a predefined floor height, wherein the microdots corresponding to the non-printing indicia define the predefined floor height. An exemplary method for providing such depressions includes the steps of forming a subfloor at the thickness below the predetermined floor height by performing a back-exposure step at an energy intensity less than that required to create the predefined floor height, and then forming the predefined floor height by distributing a plurality of microdots in locations in which the predefined floor height is desired and by omitting microdots in locations in which the depressions forming the indicia are desired.

One embodiment comprises a system for making a flexo plate comprising processing equipment configured to perform one or more process steps in a workflow, the processing equipment having a controller and at least one variable operating parameter controlled by the controller, including one or more units of processing equipment configured for providing non-printing indicia on the flexo plate disposed on a floor of the plate using microdots. The processing equipment may include one or more of: imaging equipment, curing equipment, washing or other non-cured-polymer-removal equipment, printing equipment, cutting equipment, or a combination thereof, and the non-printing indicia is configured for persistent readability downstream of the washing or other non-cured-polymer-removal and optional cutting steps without printing in the printing step. In some embodiments, the non-printing indicia may be in the form of one or more elevations having a plate thickness above a predefined floor height, wherein the microdots corresponding to the non-printing indicia define the one or more elevations. In some embodiments, the non-printing indicia is in the form of one or more depressions having a plate thickness below a predefined floor height, wherein the microdots corresponding to the non-printing indicia define the predefined floor height.

Another aspect of the invention comprises a flexo plate comprising non-printing indicia disposed on a floor of the plate in the form of areas of presence and absence of polymer in the plate floor defined by microdots. The non-printing indicia may be configured for persistent readability, such as downstream of washing or other non-cured-polymer-removal and optional cutting steps, without printing in a printing step of a plate workflow. The non-printing indicia may be in the form of one or more elevations having a plate thickness above a predefined floor height, wherein the microdots corresponding to the non-printing indicia define the one or more elevations, or the non-printing indicia may be in the form of one or more depressions having a plate thickness below a predefined floor height, wherein the microdots corresponding to the non-printing indicia define the predefined floor height. The microdots may define alphanumeric characters or may define a repeating pattern of alphanumeric characters, non-text graphics, or a combination thereof. The alphanumeric characters may embody information including job number, separation color, version, date, or a combination thereof. The indicia may comprise branding information. The non-printing indicia may comprise a line oriented to align with an element of plate processing equipment and operative to check alignment of the plate relative to the element of plate processing equipment.

Some embodiments may include non-printing indicia comprising a plurality of plate structures derived from processing at least two different types of microdots. At least a portion of the non-printing indicia may comprise the plurality of plate structures derived from the at least two different types of microdots in a combination that is visible because of a difference in size between plate structures derived from one of the microdot types as compared to plate structures derived from another of the microdot types. Such a difference in size may signal a presence of suboptimal processing conditions with respect to at least one processing parameter that is not in accordance with a specification. The suboptimal processing condition may relate to a processing parameter selected from the group consisting of: optical focus or cleanness, actinic radiation exposure parameters, type of manufacturing equipment. At least a portion of the plurality of plate structures derived from the at least two different types of microdots may include at least a first structure comprising microdots formed from a first, relatively greater number of pixels and a second structure comprising microdots formed from a second, relatively lesser number of pixels. In such embodiments, deviation of one or both of the first structure and the second structure from an expected height above the floor signals the presence of the suboptimal processing condition. A plurality of structures comprising microdots formed from different numbers of pixels may be provided, including at least one non-printing microdot formed from a number of pixels expected to form non-printing indicia under optimal processing conditions and at least one printing microdot formed from a number of pixels expected to form printing indicia under optimal processing conditions, wherein actual height of one or both of the first structure and the second structure signals the suboptimal processing condition.

Still another aspect of the invention comprises a non-transitory computer readable storage medium having data stored therein representing instructions for imaging a first plurality of printing dots defining a screened image for making printing structures on a flexographic printing plate and a second plurality of non-printing microdots defining non-printing indicia. The non-printing indicia define one or more features selected from the group consisting of: alphanumeric characters, non-text graphics, a repeating pattern of alphanumeric characters, a line, and indicia comprising at least two different types of microdots. The non-printing indicia may comprise at least two different types of microdots including at least one type of microdots having a relatively greater size configured to be visible on a plate processed under optimal conditions and another type of microdots having a relatively lesser size configured not to be visible on a plate processed under suboptimal conditions. The non-printing indicia may comprise at least two different types of microdots in a combination configured to be visible on a plate processed under suboptimal conditions because of a difference in size between plate structures derived from one of the microdot types as compared to plate structures derived from another of the microdot types. The instructions relating to the non-printing indicia may be configured to generate one or more elevations having a plate thickness above a predefined floor height, wherein the microdots corresponding to the non-printing indicia define the one or more elevations in locations that do not provide support for a printing dot. The instructions may instead or also be configured to generate non-printing indicia is in the form of one or more depressions having a plate thickness below a predefined floor height, wherein the non-printing microdots define the predefined floor height.

DETAILED DESCRIPTION OF THE INVENTION

Figure 1:
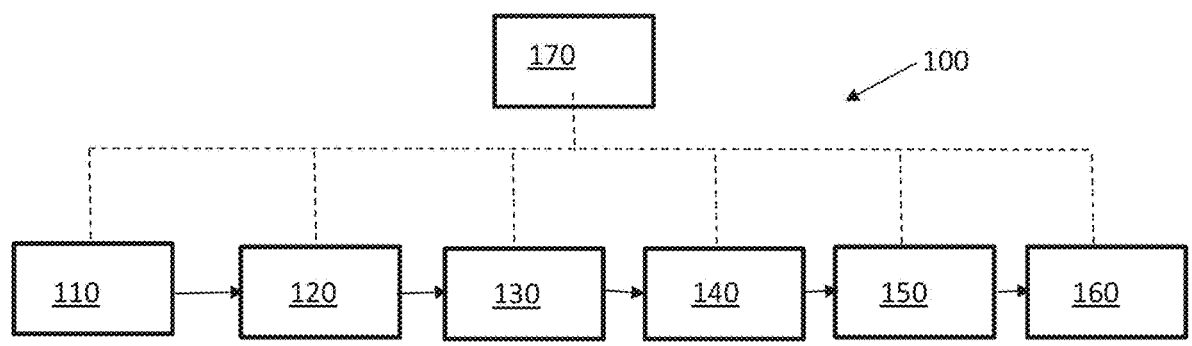
FIG. 1 is a schematic diagram depicting an exemplary embodiment of the invention comprising a workflow process with a tracking controller.

Referring now to the figures, FIG. 1 schematically illustrates a workflow 100 having a plurality of process machines 110, 120, etc. each configured to perform one or more process steps in the workflow of creating a printing plate.

Figure 2A:
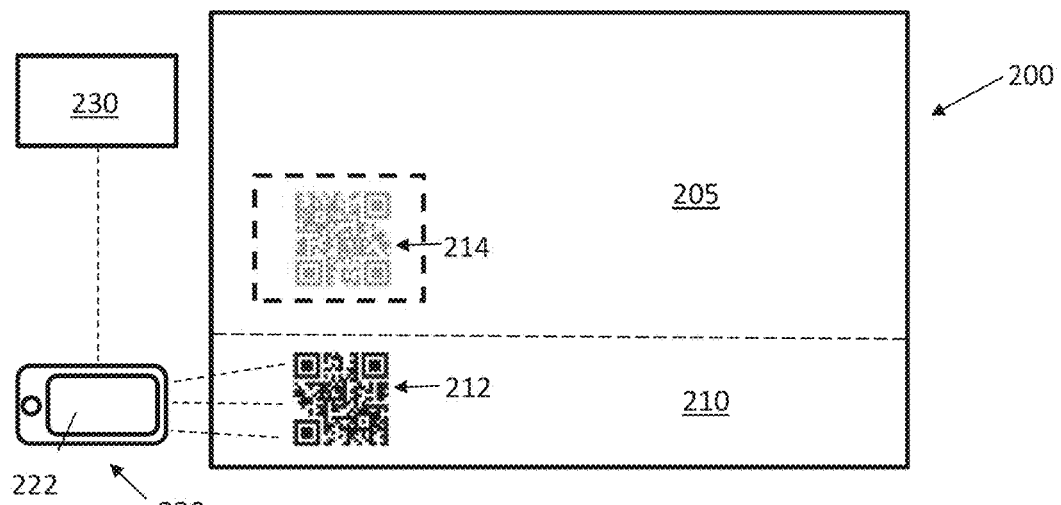
FIG. 2A is a schematic diagram depicting a plate having indicia read by a reader in communication with a controller in an exemplary workflow system embodiment of the invention.
Figure 2B:
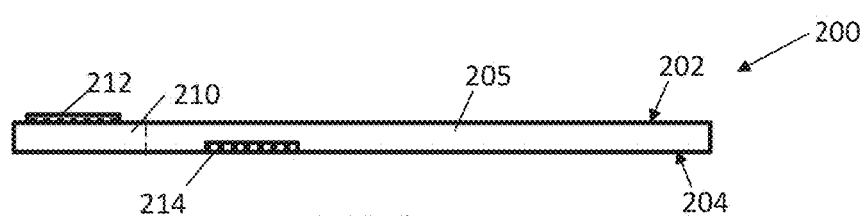
FIG. 2B is a schematic cross sectional diagram of an exemplary flexo plate having first and second indicia in accordance with one embodiment of the invention.

As depicted in FIGS. 2A and 2B, one aspect of the invention provides a marking method and structure for flexographic printing plates 200 and their precursor states, which enables the association of up-to-all process-relevant information to the plate itself by attachment of indicia 212, 214 to the plate, and thereby enables controlling up-to-all process stages using this information. Preferably, the processing machines used for the plates are also configured with or in communication with a reader 220 configured to read the marks, and configured to receive process parameters required for the plate to be processed and to report the status of plates being processed to a central control computer 170, based upon information derived from reading the marks. Embodiments of the system thus enable monitoring and control of the complete platemaking process for all plates in the workflow chain from order intake to plate storage after printing.

While the parameters for RIPping and imaging are provided directly from a computer by a data file, the parameters for the remaining steps are ideally attached to the plate in accordance with aspects of the invention. Exemplary steps in the workflow may include a UV exposure step performed by a UV exposure system 110, a thermal or chemical processing step performed by thermal or chemical processing apparatus 120, a finishing step performed by finishing apparatus 130, a cutting step performed by cutting apparatus 140, mounting one or more cut portions of a plate onto a substrate with a mounting apparatus 150, and printing in a flexo process with a printer 160, using the substrate having the plate portions mounted therein. Additional steps may also be included in the workflow at the beginning or end, and interposed between any of the steps specifically depicted. For example, an imaging step typically precedes the UV exposure step, an ordering step typically precedes the imaging step, and a storage step follows the printing step. The blocks associated with each processing step are exemplary only, and a single machine may perform steps related to multiple blocks, or multiple machines may together perform the steps illustrated in a single block. Some steps depicted may be optional.

Figure 5:
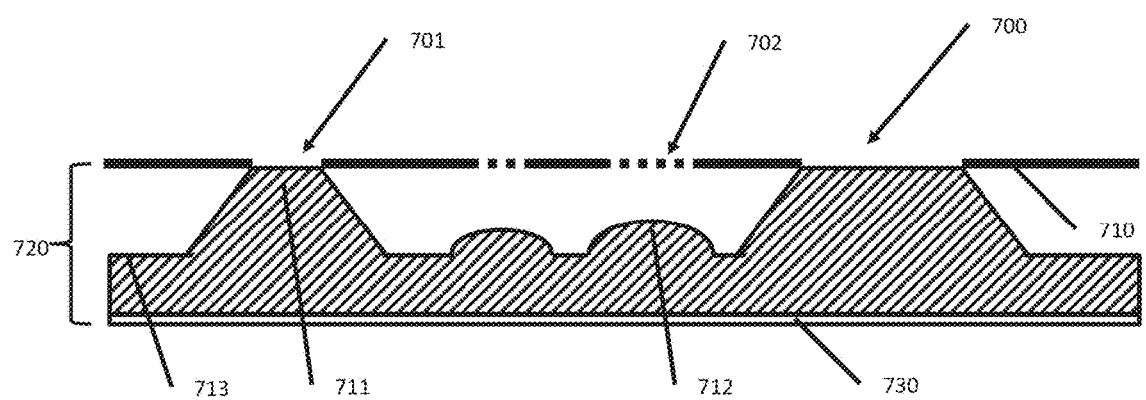
FIG. 5 is a cross-sectional schematic view of a portion of an exemplary printing plate, showing the LAMS layer and mask openings therein for creating printing and non-printing information.
Figure 6:
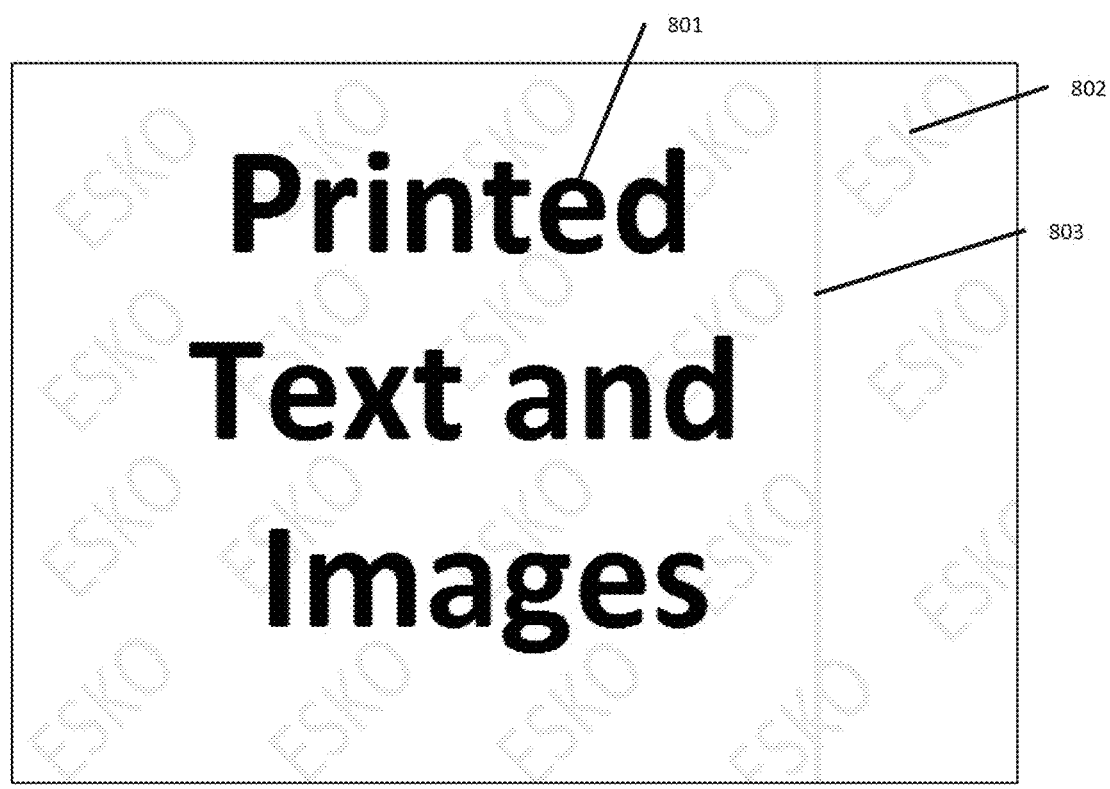
FIG. 6 is a plan schematic view of a portion of an exemplary printing plate showing printing and non-printing information, wherein the non-printing information is in the form of elevations above the plate floor.

This attachment to a plate 200 may be accomplished, for example, using machine-readable indicia 212, which may be a 2D code such as a QR-code or a barcode, a radio-frequency identification (RFID) module, or a magnetic strip. One form of machine-readable indicia may comprise a 2D code in the form of alphanumeric characters readable by a human as well as configured to be captured by a camera and processed using text recognition software known in the art, such as is depicted in FIGS. 5 and 6. Such embodiments have the advantage of providing a code on the plate that can be read and interpreted by both a human operator and a machine. The RFID module may be inserted into the polymer before or after curing at a spot of solid image area on the plate where the polymer is to be cured (and thus retained on the fully exposed plate). In exemplary embodiments with a magnetic strip, the strip is preferably attached to the rear side of the plate on the dimensionally stable PE layer of the plate, where the strip is positioned to contact a reading head mounted on the processing machine as the plate is processed. The magnetic strip may be attached as a completed strip formed by any method known in the art, or may comprise a magnetic ink dispensed directly onto the rear side of the plate. Although the indicia 212 is depicted as a QR code in the figures, it should be understood that the QR code in the figures is intended as a schematic representation application to any of the types of indicia described herein, or their equivalents.

Although certain indicia have been explicitly described, the term "indicia" is intended to have its broadest meaning of "an indication" or "distinguishing mark," without limitation to how that indication or mark is capable of being read, and thus the "equivalents" of the indicia as expressly described are intended to be broadly construed. While certain machine-readable indicia or codes may take advantage of formats that are exclusively machine readable to permit a large volume of information to be stored in a small amount of space, it should be understood that the term "machine readable," as used herein to refer to indicia and codes, is not limited to indicia having a format that is exclusively machine-readable. Those of skill in the art will appreciate that human readable alphanumeric information is also machine readable by a reader equipped with suitable optical character recognition (OCR) functionality, and that the hardware and software for providing such functionality is well known in the art and becoming more ubiquitous. For example, many highway toll authorities now use character recognition of license plates as an equivalent to, a substitute for, or supplement to RFID pass technology. Furthermore, machine vision systems and human operators alike can also be trained to read non-alphanumeric graphic symbols to convey information that can be universally understood (e.g. the graphic symbols denoting recyclable materials or laundry care recommendations). Thus, it should be understood that the terms "indicia" and "machine readable" are intended to be broadly interpreted to include, without limitation, in addition to the other types of indicia discussed in detail herein, printed or otherwise visible alphanumeric or graphical information configured to be read and comprehended by human operators as well as machines, as well as combinations of indicia that are exclusively machine readable with indicia that is both human and machine readable. One advantage of using machine-readable indicia that is also at least partially human readable, is that an experienced human operator may be able to process and act upon at least some codes faster than it would take that same operator to enlist the assistance of a machine.

In some embodiments, the code for a printed code, such as a bar code or a QR code or printed indicia comprising text and/or graphics readable by a human or machine, may be added during ripping the image file and is thus included in the content of the image information, such as in the .LEN file or encrypted LENx file associated with an Esko PlatePrep workflow. Adding a code to an image file may be accomplished using, for example, Esko DeskPack™ barX software, which software comprises machine-readable instructions embodied in storage media, such as a hard drive, a flash drive, or any type of media, as is well known in the art. As described herein, the imaged information may be provided in the form of non-printing structures on the plate floor formed using microdots, including in the form of a non-printing watermark derived from the use of non-printing microdots in a printing portion of the plate. Such structures formed from microdots may be created on a flexo plate using an Esko® XPS exposure system.

The following examples refer to QR-codes as the exemplary information storage technology, but the invention is not limited to any particular information storage technology, and is applicable to any information storage technology known in the art capable of conveying the amount of information required to practice embodiments of the invention, and in particular, to any of the storage technology expressly described herein.

In preferred embodiments, all processing equipment 110-160 in the workflow 100 are provided with or connected to a scanner or other information capture device, herein referred to as a "reader," which allows reading the indicia to obtain the associated plate process parameters. Thus, in preferred embodiments, before starting the process or processing step, process information is scanned from the plate and the relevant process parameters are set accordingly. For example, where the indicia 212 comprises a visible code, such as a QR code or a barcode, the reader 220 may comprise a mobile device, such as a mobile phone, a handheld computer, a tablet, or the like. Although reader 220 is depicted as a "phone," it should be understood that the figure is intended to be a schematic representation of any applicable reader, and may comprise any type of reader known in the art suitable for reading the indicia provided. Thus, for example, where code 212 comprises an RFID tag, the reader comprises an RFID reader, and where code 212 comprises a magnetic stripe, the reader comprises a magnetic stripe reader. The technologies and apparatus associated with reading 2-dimensional printed codes, magnetic stripes, and RFID tags are well understood in the art. Reader 220 is connected to controller 230 of the apparatus for performing the identified process step. The connection between the reader and the controller may be a wired or wireless connection. An exemplary wireless connection may comprise a local wireless network running on computers local to a facility in which the processing step is located, or may be a network connected to a global information network or wireless communication network. Controller 230 may be programmed with instructions for translating the information derived from the indicia into the information required to set the corresponding parameters of the processing equipment, or the translation instructions may be contained in the reader. The information derived from the reader may be embedded directly in the indicia, or the indicia may comprise information corresponding to an address in computer storage on a network where the information resides in communication with the reader and the controller. The information corresponding to the address may be a URL, a process identifier, or a unique plate identifier. In an embodiment in which the information is a unique plate identifier, the system may be configured to use the unique plate identifier to find the corresponding instructions, such as using by using the plate identifier to query a lookup table that resides at a known address. In embodiments where tracking specific plates is not of interest, and where the processing instructions corresponding to the universe of plates to be processed have only a limited number of permutations, the information corresponding to the address may be a process identifier rather than a unique plate identifier. In such embodiments, the process identifier may be used for querying a corresponding lookup table of process instructions corresponding to each process identifier. In embodiments in which the instructions are embedded in the identifier, the indicia may also further embody a unique plate identifier, wherein the plate identifier may be used for tracking the plate or identifying the plate, such as with a mobile device, as described herein later.

Process information may include, for example and without limitation: the job name, customer name, printer's name, plate type, plate thickness, back exposure energy, preferred back exposure time, main exposure energy, preferred main exposure time, number of main exposure cycles, plate processing speed, plate processing temperature, plate cutting path, plate cutting speed, and the like.

In one embodiment of the invention, process information is stored in the indicia 212, such as a QR code. Reading a QR code from a plate can be performed with an existing QR-code reader (i.e. a code scanner) known in the art. For example, a model C5PC003 code scanner from Wenglor is suitable for omnidirectional scanning of 1D and 2D codes, including but not limited to 1D codes (commonly referred to as "barcodes"), such as Code39, Code93, Code128, UPC/

EAN, BC412, Interleaved 2 of 5, Codabar, Postal Codes, Pharmacode, and 2D codes, such as DataMatrix ECC 0 . . . 200, PDF417, Micro PDF417, QR-Code, Micro QR-Code, Aztec Code, GS1 Databar, and Dot code. The indicia used for providing the information is not limited to any particular type of code. In order to increase contrast and readability of the code on the plate, light from a light source (not shown), such as a light typically associated with a camera flash for a mobile device, may be applied from the bottom or the top of the plate. In preferred embodiments, process parameters for different stages are embodied directly in the code such that each individual processing unit can derive instructions directly from the code on the plate without having to connect to a network. In other embodiments, the code may comprise a computer storage address where the process information is stored, and the reading step comprises reading the information, connecting to the storage address embedded in the information such as via a hyperlink, reading the information from the storage address, and communicating relevant stored information to the processing machine.

In one embodiment of the invention, illustrated in FIGS. 2A and 2B, the information is at least initially stored in a first indicia location 212, such as in the form of a QR code, which location is disposed on a test strip 210 adjacent the image area 205 of a flexo polymer plate 200. This test strip may also contain register and color proof marks for setting up the press. While, preferably, the register marks and other marking on the test strip (and thus also the QR code, when placed on such a test strip) stay on the polymer plate together with the image for the entire life of the plate, in some embodiments it may be necessary to cut the test strip away from the plate to avoid printing the information on the test strip, such as a QR code, on the printing substrate. Embodiments to address this situation are discussed herein later.

Providing code information that is persistently readable during all process steps (e.g. imaging, curing, washing, printing, and optional cutting and storage steps) is a challenge in connection with washing processes associated with flexo plates, because most washing processes are solvent-based. The solvent not only removes non-cured portions of the flexo plate polymer, but it also removes ink of the type typically used on printed labels and marker pens. Thus, one aspect of the invention relates to providing a code configured to survive a washing step by making the code part of the image or by inserting information into cured portions of polymer. For example, an RFID device may be inserted into the cured portion of the polymer mechanically, or a magnetic strip may be disposed on the surface of the dimensionally stable layer on the rear side of the polymer plate where it is positioned to be read by a magnetic card reader head as is known in the art. Such an RFID device or mag strip must be capable of surviving the downstream processing steps, however. While adding coded information to the image enables persistence past the washing step, in some embodiments it is undesirable for the codes to be printed. Thus, preferred embodiments may include codes embodied in the plate in a way that is persistent past a washing step, but not printed in a printing step. In one embodiment, the code is added only in the plate floor, such that the details do not reach the printing surface, as described below. In another embodiment, the code is placed in a location beyond the desired portion of the printed image (e.g. in a test strip) and, in some cases, the code is transferred to another location prior to or during a cutting operation, as described below.

As used herein, the "washing" step may refer to any non-cured-polymer-removal step that removes non-cured polymer from the plate. Such a "washing" process may include a traditional solvent (or water) washing step, or may also include a thermal method, such as those commonly associated with DuPont™ Cyrel® FAST Thermal Workflow or MacDermid® LAVA® plates, as known to those of skill in the art. Thus, the phrase "washing step" as used generally herein should be understood to refer to any non-cured-polymer-removal step, absent explicit reference to specific washing processes.

Indicia Formed of Non-Printing Structures

In some embodiments, to keep the information in the code on the plate 200, instead of being located on a plate top surface 202, the 2D code, such as a QR-code 214, may be positioned in the plate floor 204. The plate floor is built by polymer that has been cured from the backside of the plate, but it is not intended to print, thus the thickness of the floor stays below the level of the printing top surface of the polymer.

Although not limited to any particular method for providing the indicia, there are several preferred ways for providing indicia structures into the polymer. One preferred method is to provide the indicia via UV exposure through an imaged mask, such as via direct imaging in the mask. This method may place sunken structures on the printing surface level, or microdots that produce elevated structures on the floor or depressions relative to the floor. Another method is laser engraving, which may provide sunken structures below either the printing surface level or the floor level. Yet another method is to mill sunken structures below either the printing surface level or the floor level.

In some embodiments, a code 212 that resides below the top (printing) surface 202 of a test strip 210 of the plate 200 during some process steps may be transferred from the top surface to the floor surface 204. For example, code 212 may be scanned by the reader and the code or code image stored in a data file and then that data file may be used for instructing the cutting of a reproduction of the code image 214 into a floor portion 204 of the image area 205 of the plate while the plate is on the cutting table. As depicted in FIG. 2A, code 214 depicted in a lighter shade is intended to represent its location on the floor of the plate where it will not cause an image corresponding to the code to print when the top surface is used for printing. As depicted in FIG. 2B, code 214 (solid lines) may be cut into floor 204, such as formed by laser engraving or cutting with a milling head.

Microdots and Watermarks

In another embodiment, the code 214 (dashed lines) may be formed on top of the floor surface 204, such as formed using microdots in the LAMS layer during the exposure step, such that the code rises to a level above the floor 204, but below the top printing level 202. A particular method for storing a code on the plate floor comprises using microdots, such as are disclosed in EP 1 557 279 B1, incorporated herein by reference. FIGS. 4-12 depict embodiments relating to this aspect of the invention. The use of non-printing microdots for raising the printing floor to provide support for marginally printable image features is also well known, such as is described in U.S. Pat. No. 7,126,724. The microdots as generally described, herein, however, are not intended to provide support, and are typically disposed in locations far enough away from printing dots so as not to provide such support. Rather, the microdots are used for creating non-printing indicia having functionality as described further herein. Some embodiments described herein may include a combination of microdots providing support and not providing support, however.

The term "microdots" as used herein primarily refers to small mask openings in the LAMs layer of a flexo plate, wherein each opening is not wide enough to grow a printable screen dot in isolation (under normal power), but clusters of them (or single pixels with sufficient boost) are operable to raise the plate floor level. The term microdot may also refer to any dot used in any imaging step by any process capable of creating a non-printing dot structure on a plate, including but not limited to direct curing processes and non-LAMS mask-based processes. As used herein, the term "microdot" may be used to refer to a feature in the image information used by the imager for creating the plate or mask structure, as well as the plate structures formed thereby. In some embodiments, a cluster of microdots may be used to form sections of elevated floor relative to other sections of the floor that remain non-elevated and arranged in a formation resembling the dark and light sections in a QR-code or a barcode. In other embodiments, described in more detail below, microdots may be used to form the floor and an absence of such microdots may be used to provide depressions in the floor. In still other embodiments, microdots may also be used to create a combination of elevated and depressed structures relative to a predetermined floor level. The microdots in the mask result in microstructures (elevations or depressions) in the exposed plate.

Figure 4:
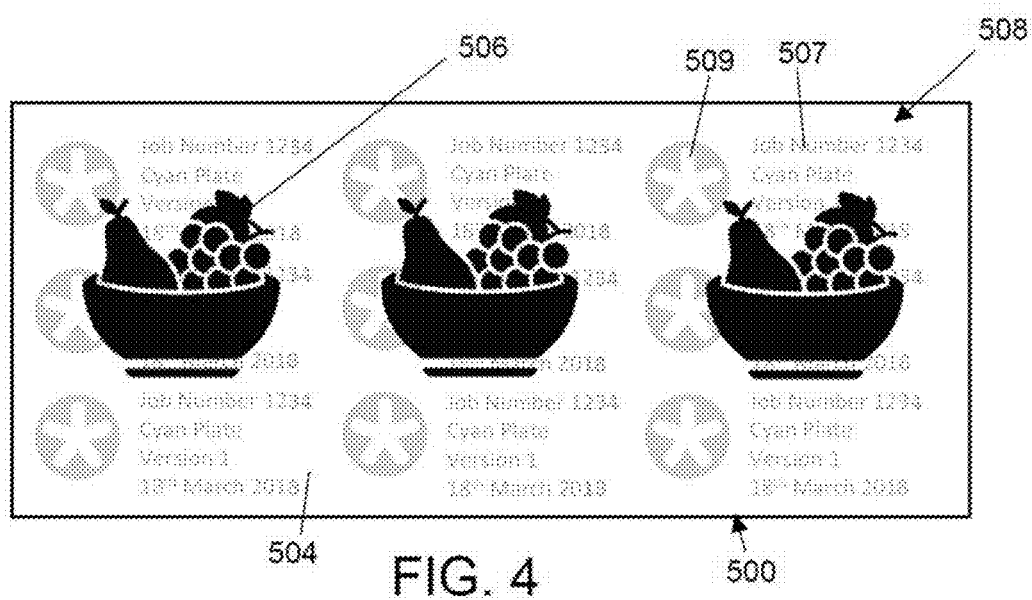
FIG. 4 is a plan schematic view of a portion of an exemplary printing plate comprising repeating indicia at a non-printing depth comprising a watermark in accordance with an embodiment of the invention.

For example, FIG. 5 depicts an exemplary cross-section of a portion of a printing plate 700, a floor 713, printable structures 711 formed from screen dots 701, and non-printing structures 712 formed from microdots 702. FIG. 4 depicts an exemplary portion of printing plate 500 showing floor regions 504 in white, printable patterns 506 comprised of printable screen dots in black and non-printing indicia 508 in gray. Non-printing indicia 508 includes text 507 and graphics 509 in a repeating pattern that forms a non-printing "watermark." As depicted in FIG. 4, the watermark comprises a graphic 509 and text 507 that repeats in a grid pattern (comprising 3 columns and 3 rows as depicted in FIG. 4, but not limited to any particular configuration. Text 507 includes information regarding the job (e.g. "Job Number 1234"), the separation associated with the plate (e.g. "Cyan Plate"), the version of the plate (e.g. "Version 1") and a date associated with the plate (e.g. "18 Apr. 2019"). The invention is not limited to any particular type of text or graphics, however, and may include branding information such as logos or trademarks (e.g. graphic 509 is a graphic logo associated with Esko) identifying the plate owner, plate designer, the maker of the workflow system that created the plate, or the like. Although depicted in FIG. 4 with watermark 508 including both non-text graphical indicia 509 and textual indicia 507 readable by a human (and a suitably configured machine vision system coupled to a processor programmed with character recognition capability), the watermark may comprise only non-text graphics or only textual indicia. Graphical indicia may include any type of indicia as disclosed herein, including but not limited to machine-readable codes including but not limited to barcodes and QR codes.

The term "watermark" is used herein as an analog to the original definition of the term for the identifying images or patterns on paper that appear as various shades of lightness/darkness when viewed by transmitted or reflected light (at certain angles or atop a dark background), caused by thickness or density variations in the paper. Such watermarks are often visible in the paper constituting an original document, but not in reproductions (e.g. photocopies) made from that paper. By analogy, the non-printing watermark formed in accordance with embodiments of the invention may be more visible under certain conditions (e.g. reflected light at a certain angle) and comprise a variation in thickness of the plate, with the markings not reproduced in printed matter made by the subject plate.

As depicted in FIG. 6, text indicia 802 is visible relative to the floor of the plate, and may be more visible in light transmitted through the plate or reflected at certain angles. The watermarked indicia 802, having a relatively lesser height above the floor, is distinguishable from printable text 801, having a relatively greater height above the floor. Watermark structures using microdots give the ability to add non-printing information such as trademarks and logos to the polymer plate that identify the source of the plate, processing equipment, or other entities involved in the workflow to create the plate that is ready to print. Because using microdots create a challenge in RIPping the image file, imaging the mask, and curing the plates, the presence of microdots organized into visible structures may also serve as proof that high-quality equipment was used for manufacturing the printing plate, and may provide quality information regarding the manufacturing process. Thus, for example, microdot-based indicia may be used not only to provide proof of the plate's origin or proof the plate was made with a certain type of equipment, but also proof that the manufacturing process was successfully completed, including proof the floor thickness is correct, and proof the plate is/was mounted/aligned properly (e.g. on the printing cylinder).

Figure 11A:
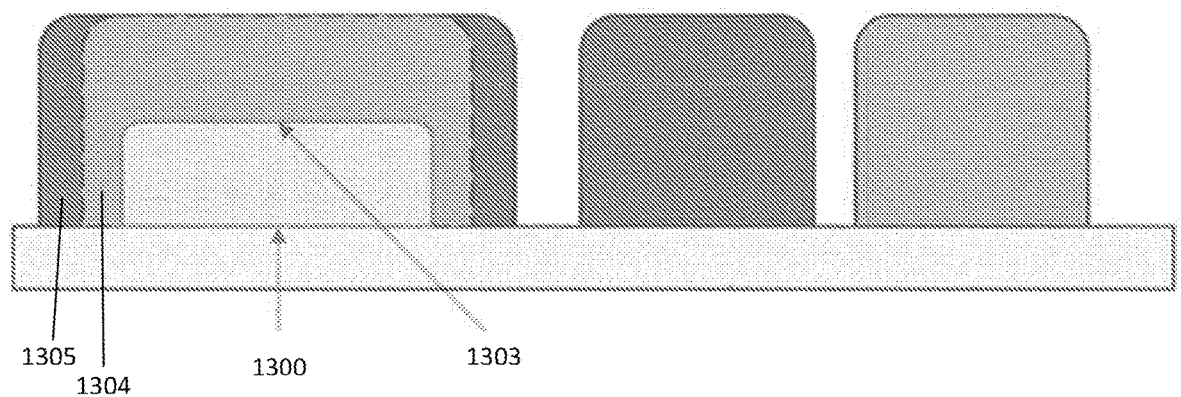
FIG. 11A is a side view of an exemplary set of targets for indicating plate floor height.
Figure 11B:
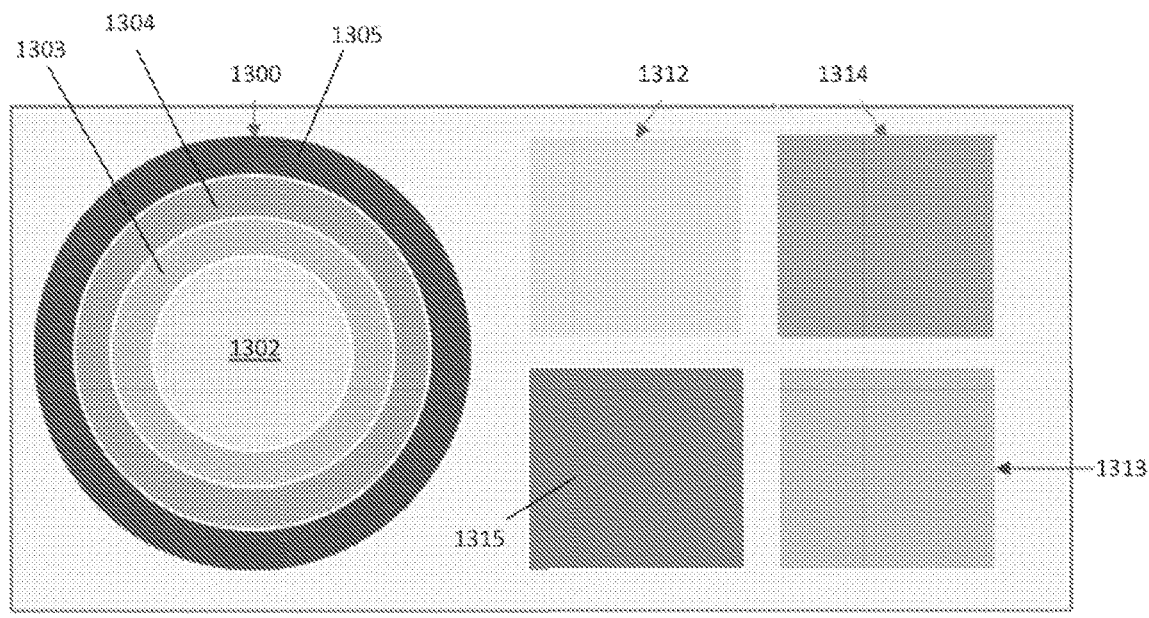
FIG. 11B is a plan view of the exemplary set of targets of FIG. 11A.

One method for using microdot-based indicia for showing proof of correct floor thickness is to create a plurality of test target structures designed to have a mixture of dots in the target structures stable enough and not stable to survive the washing process, such as the target structures depicted in FIGS. 11A and 11B. For example, a set of concentric rings 1300 may be formed of a first number of pixel dots forming a central ring or circle 1302, a second number of pixel dots in a first intermediate ring 1303, a third number of pixel dots in a second intermediate ring 1304, a fourth number of pixel dots in an outermost ring 1305, and so on, with each level increasing in size (e.g. 2×2, 3×3, 4×4, 5×5 . . . pixels). Differences between numbers pixels in sequential dots may be greater (e.g. 2×2, 4×4, 5×5 . . . ) or lesser (e.g. 1×2, 2×2, 2×3, 3×3 . . . ) than the example above, as dictated by needs for distinguishing between levels and number of different levels provided. In another embodiment, a set of block target structures may comprise successively increasing numbers of pixel dots in each of blocks 1312, 1313, 1314, 1315, and so on, similar to the different numbers of pixels for ring structures. In the exemplary structures, an expected number that is fewer than all of the blocks/rings should have an expected growth level (e.g. a measured height that reaches the printing surface) in a perfect height floor. If fewer than the expected number of blocks/rings reach the expected height, it signifies that the floor is too low. If more than the expected number of blocks/rings reach the expected height, it means the floor is too high. Although depicted with blocks or rings with four different sizes of dots for illustration, embodiments with more or fewer than four may be provided. For example, embodiments with nine different sizes may be preferred. The variation in mask opening may be adjusted to a given plate and a target floor thickness that produces dots of the middle field (e.g. 5th block in a 9-block field) standing at the expected height (e.g. the printing surface of the plate) when the floor thickness is according to the correct specification. In the nine-block example, if the floor is too thick, the fourth or third field may reach the surface, and if the floor is too thin, the first field reaching the surface may be the sixth or seventh block. Embodiments in which the microdots surround normal printing dots that are supposed to grow to the printing surface of the plate may also be provided.

The range of acceptable floor height may include heights in which some of the structures have noticeably different visibility than others, and embodiments may be derived in which the differences between proper conditions and improper conditions may be detectable based upon visibility or non-visibility of the different fields, rather than requiring an objective measurement in every instance. For example, as depicted in the side view of FIG. 11A, the concentric ring 1303 is depicted as being present above the floor with a height that is less than the height of rings 1304 and 1305. Although depicted with a total of four structures/rings, it should be understood that more or fewer structures may be provided, with a minimum of two structures required (one that should have the expected height, and one that should not have the expected height in a perfectly made floor). The examples provided herein are for illustration only. While other methods for providing human readable information on the plate floor, e.g. by laser engraving of the polymer after the plate has been processed, as discussed herein and in the applications to which the subject application claims priority, methods other than imaging with microdots require additional, time-consuming process steps and machinery.

As understood to those of skill in the art, microdots are clusters of tiny mask openings in the LAMs layer of the photopolymer plate, the amount of UV light (or other actinic radiation) is not great enough for curing structures on the plate floor that reach the top of the plate, but it is sufficient to create structures on the plate floor that are typically visible.

One method for making microstructures can be described with reference to FIG. 5. Polymer plate 700 comprises a LAMs layer 710, a polyethylene backing layer 730, and photo curable polymer 720 in between. Hatched portions depicted in FIG. 5 are those portions of the plate that have been cured through the mask openings 701 and 702 and the backing layer 730 and that will stay on the backing layer after LAMs and non-cured portions of polymer have been removed in a washing process.

Actinic radiation (e.g. UV light) entering the plate through the backing layer forms the so-called floor 713 of the plate. This is a solid layer of polymer that builds the base for the structures as further described herein. The thickness of each structure is determined by the amount of light energy the polymer receives. At the places where regular mask openings 701 are located, printing structures 711 grow from the floor to the top of the plate. In places where microdot mask openings 702 are located, non-printing structures 712 grow on the floor but do not reach the top of the plate, and thus do not transfer ink later in the printing process.

Several parameters have influence on the growth of non-printing structures on the plate floor. For example, the microdot mask opening must have a diameter that is small enough not to grow printing dots that reach the plate's printing surface, but wide enough to allow a sufficient amount of energy to enter the polymer to cause polymer chain growth. The mask opening may be modified by the number of pixels in the image that build each microdot mask opening or by the laser power for individual pixels used in imaging the mask, such as using ESKO pixel boost technology. The distance from one opening to another affects the amount of energy per surface unit that can enter the plate. The curing radiation (e.g. UV light) intensity and exposure time, and number of repeating exposure steps also affect the structure growth for a given mask opening size. The sensitivity of the photopolymer also has an influence on structure formation, and the washing parameters have an effect on the structures that remain on the plate, particularly for microdot structures not polymerized to the plate printing surface.

In one embodiment, the microdots are used to underlay a brand name as proof of the plate's origin. Thus, for example, as depicted in FIG. 6, the entire floor surface of the plate may be covered by a source indicator 802 ("ESKO") formed of non-printing microdots. As depicted in FIG. 6, the ESKO mark is rotated by 45° with respect to the plate edges, but such types of branding are not limited to any particular orientation, repeat pattern, or the like. Printable details 801 ("Printed Text and Images"), formed of structures that will print when the plate is inked and placed in contact with a substrate for receiving the ink, are also shown in FIG. 6 for contrast.

The presence of non-printing structures may also be used for proofing the correct and complete execution of all process steps with qualified processing equipment. Because the creation of non-printing structures can be very demanding, incorrect parameter settings in one of the process steps may result in missing parts of the printing and non-printing details. Because printing details change continuously with the artwork to be printed, missing parts are often difficult to recognize in a standard plate based only on printing details. While it is known in some instances to print test patterns for monitoring the correct processing of the plates, these patterns typically correspond to the printing (as compared to non-printing) details.

Failure of a single process step may affect the result of the non-printing details in the final plate. Accordingly, in one embodiment of the invention, non-printing detail, which will only appear on the plate floor correctly when all process steps (imaging, UV curing, washing) are executed properly, are added to the image file to facilitate recognition of shortcomings in plate processing.

For example, non-printing detail may be added in the form of text that reads, "Focus properly set." If the focus of the laser beam is not set properly, most of the standard artwork is still visible in the LAMs mask, but fine details will get lost. In particular, the fine mask openings corresponding to microdots will get lost without correct focusing of the laser beam. The characteristics of the microdots forming "Focus Properly Set" may be selected so that this non-printing text is not readable if the focus is not properly set.

Figure 7A:
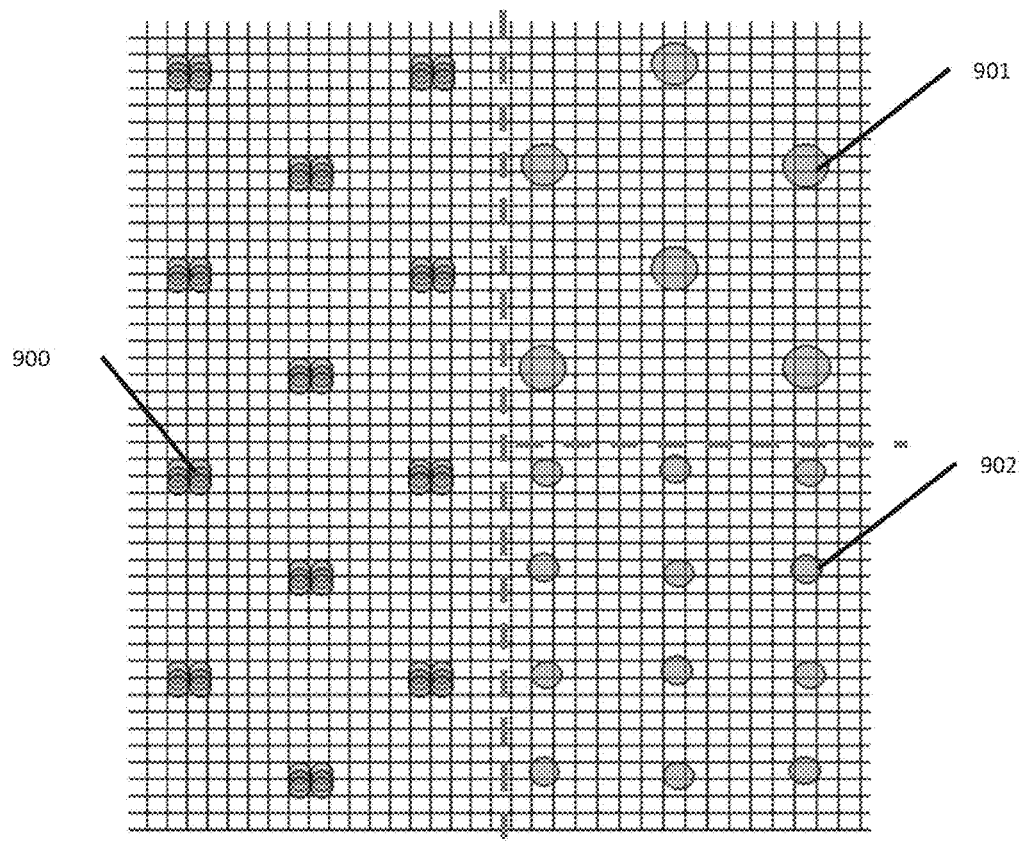
FIG. 7A depicts image information corresponding to various types of different exemplary microdot patterns.
Figure 7B:
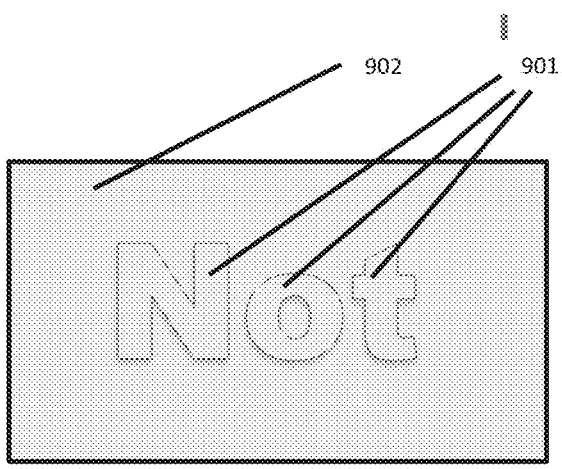
FIG. 7B is a plan view of exemplary non-printing indicia formed by different microdot structures in which the different microdot patterns have resolved to indistinguishable differences in microdot structure on the plate floor, rendering the indicia invisible.

In another embodiment, text stating "Focus not properly set" may be included in the image file to be formed with microdots. Referring to FIGS. 7A and 7B, in this embodiment, the word "not" may be imaged into the LAMs by using a first type of microdots 901 that are surrounded by a second type of microdots 902. The grid as depicted in FIG. 7A represents pixels with each block representing a pixel of the smallest size corresponding to the nominal image file resolution of the printing system. On the left side are depicted conventional mask openings 900 for creation by conventional imaging (certain beams in vertical columns of pixels are turned on for a number of pixels and ablate several pixels of openings into the LAMs layer). The ratio between ablated and not ablated LAMs determines how much cured polymer growth will be achieved on the floor during an exposure step.

This works also for boosted single pixels 901 as shown on the upper right field of FIG. 7A. Only single pixels are switched on but the laser power is turned up/boosted so much that the mask openings are much wider than the image file resolution would suggest. This produces a similar ratio between ablated and not ablated LAMs as do the conventionally imaged mask openings.

In a third variation, the same ratio between ablated and non-ablated LAMs may be created by much smaller single pixels 902, if their quantity per surface unit is increased as shown in the lower right area of FIG. 7A.

Under ideal processing conditions, all types of microdots grow the same amount of polymer on the plate floor. If the imaging system is not properly in focus, however, the bigger mask openings 900 and 901 will still create similar wide-mask openings, whereas the smaller dots 902 will not. They will produce either significantly smaller openings or no openings at all. Either way, the ratio between ablated and not ablated portions of the LAMs layer actually made in the mask by openings 902 in comparison to the openings 900 and 901 is changed.

Figure 7C:
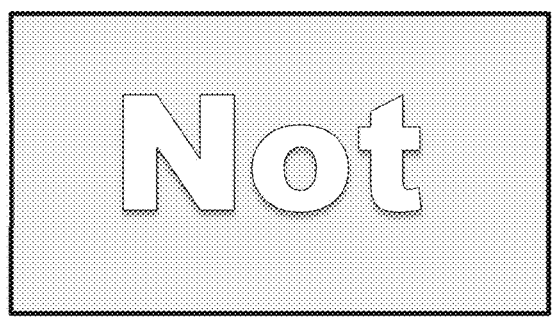
FIG. 7C is a plan view of exemplary non-printing indicia formed by different microdot structures in which the different microdot patterns have resolved to distinguishable differences in microdot structure on the plate floor, rendering the indicia visible.

In an embodiment in which the word "not" is produced by the third type of microdots 902 and is surrounded by microdots of one of the first two kinds 900 or 901, the word "not" will be invisible (as schematically depicted in FIG. 7B with the outline of the text characters shown in the figure for illustrative purposes only, but which outline may not actually be visible on the plate) as long as the polymer growth is identical for all types of mask openings. If the plate has been imaged out of focus, the smaller microdots will produce lower or no growth at all, and the word "not" will become visible, as schematically depicted in FIG. 7C.

The foregoing principle may be similarly applied to exposure parameters. For a properly executed exposure procedure, a balance in growth of non-printing structures on the floor for two different kinds of mask openings results in no differentiation between the two types of openings. Whenever the exposure procedure is not properly executed, a difference in growth between the two different non-printing structures on the floor creates a visible marker. This principle may also be used for detecting dirt on optical surfaces of the imaging system. If the optics get dirty, the focus spot becomes blurry and microdots with many relatively smaller openings do not cause the same amount of mask opening as fewer, relatively larger microdots. The same principle can be used to show that certain equipment was used for the manufacturing of the printing plate, by which use of equipment of a quality capable of producing both types of microdots will result in no visible difference between the two types of dots when formed on the plate, whereas use of lower quality equipment will produce such a difference that appears in the form as visible text.

Another application for non-printing structures on the floor may be for checking the alignment of a plate on the printing cylinder. For this purpose, as shown in FIG. 6, a straight line 803 may be formed on the floor in an orientation parallel to the circumference of the printing cylinder. During mounting the plate, or later in the press, this line can be used to check the correct parallel alignment of the plate with respect to the printing cylinder or sleeve.

Thus, as described herein, microdots are created by openings in the mask by ablating clusters of pixels in regular distance in the LAMs layer, or by ablating only single pixels in the LAMs and boosting the laser power for ablation such that the total width of the mask opening is adjusted to the desired value, such as for example, by using a Gausian Beam profile for the ablation.

Various method may be used for providing the image information for the non-printing structures in the image file used for controlling ablation of the mask.

In one embodiment, a 1-bit image file (e.g. a LEN-file of the non-printing image) may be combined additively with another 1-bit image file that contains screen information for suitable microdots. The combination of non-printing image and screen is conjunctive in that only overlapping pixels of non-printing image and screen produce a pixel in the resulting file. The screen may comprise conventional screen dots built from clusters of pixels or single pixels later boosted during imaging of the LAMs. The combined non-printing image/screen file is then combined with the 1-bit image file that contains the image information for the printing structures (which itself may comprise a combination of an image file and a screen). The combination of non-printing and printing 1-bit image files is disjunctive, in that pixels from both files are included in the resulting combination file, regardless of overlap. This process may be performed on the fly during the imaging process.

To avoid undesired changes in the highlights of the image, however, it may be desirable to block non-printing dots from overlapping with certain details of the printing files. An exemplary method for combining files is shown in the flowchart depicted in FIG. 10C. Starting with the original 1-bit printing file and original 1-bit non-printing file in step 1270, an adjusted 1-bit printing file is created by placing vignettes around the image information in the original 1-bit printing file in step 1272 (as described in more detail below with reference to FIGS. 10A and 10B. Then, the vignetted 1-bit printing file is combined with the original 1-bit non-printing file in step 1274 with a function that dictates that if a bit is "ON" in the vignetted printing file, it will be turned OFF in the non-printing file, thereby creating a corrected 1-bit non-printing file. The corrected 1-bit non-printing file is then combined with the original 1-bit printing file to create the finalized file for RIPping, in step 1276.

Figure 10A:
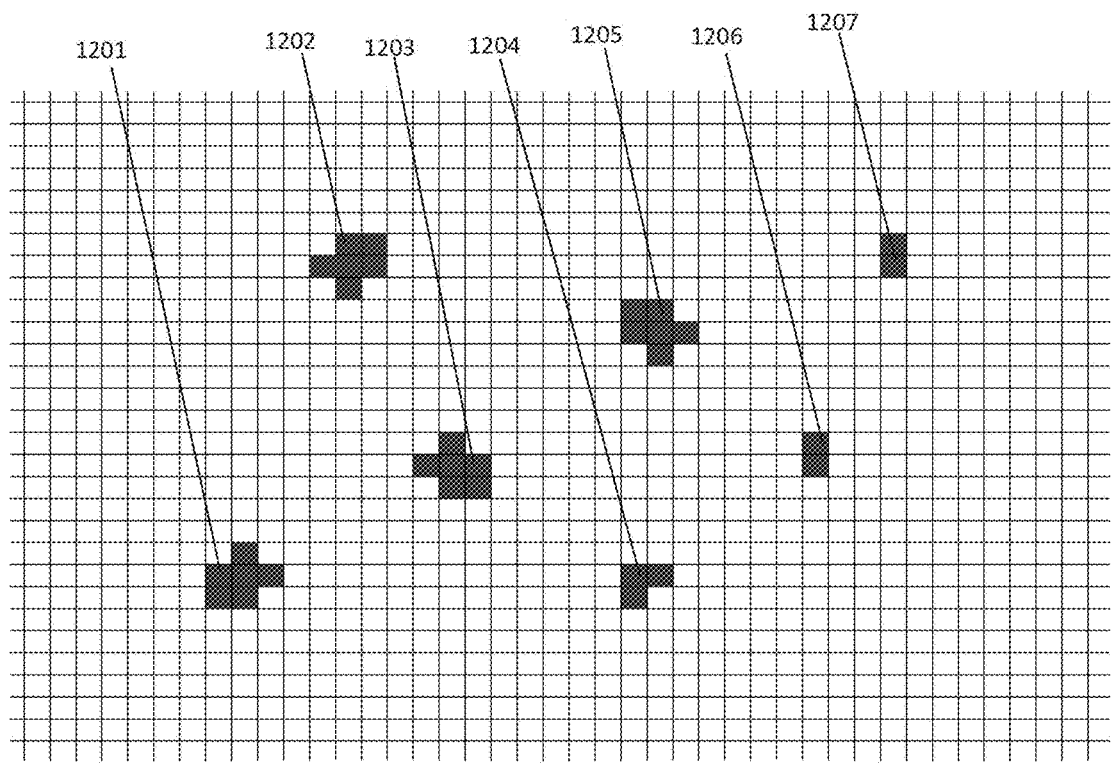
FIG. 10A is a plan view of an exemplary set of printing pixels in a 1-bit printing image file.
Figure 10B:
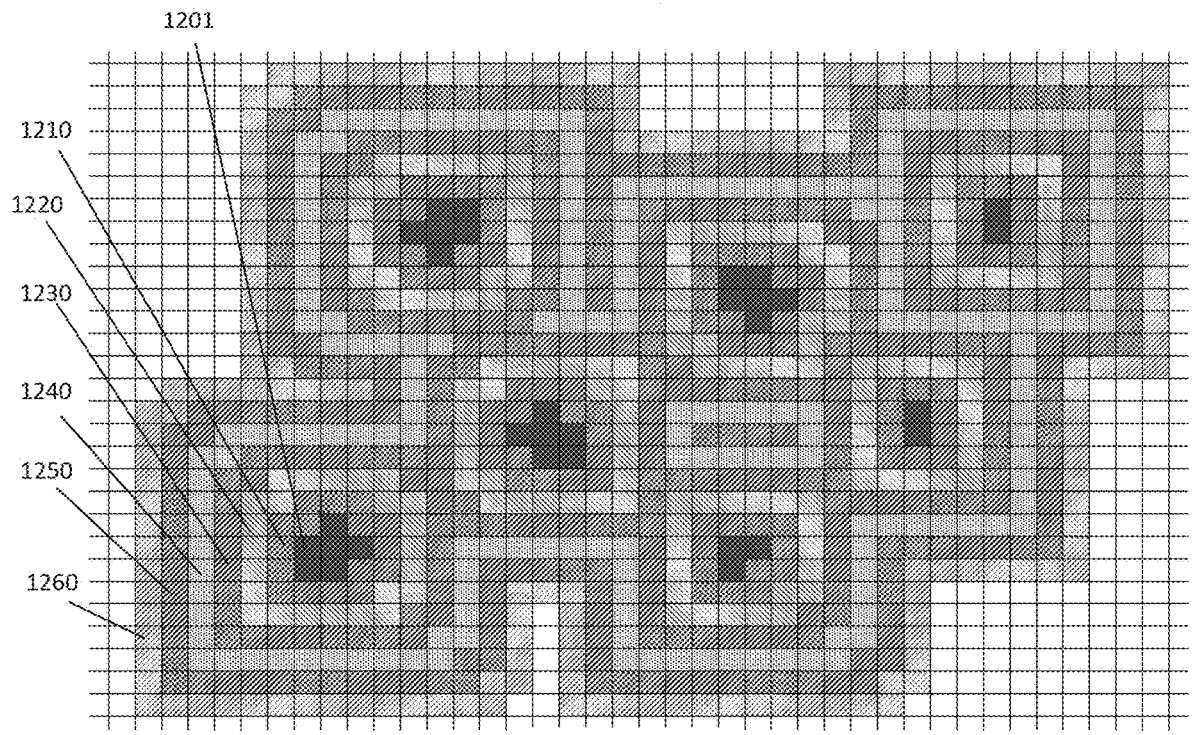
FIG. 10B is a plan view of vignettes placed around each of the printing pixels of FIG. 10A.
Figure 10C:
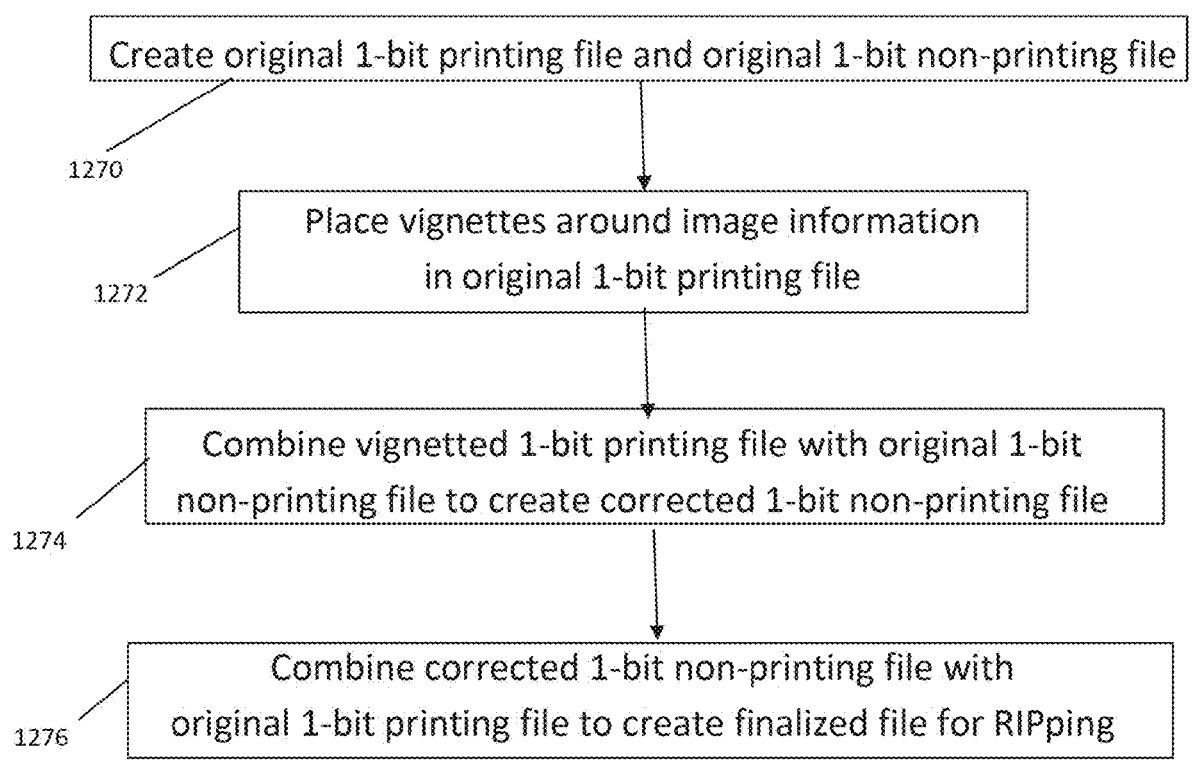
FIG. 10C is a flowchart describing an exemplary method for combining printing and non-printing files to avoid disrupting image information in the highlights.

One method for placing vignettes around the image information in the 1-bit printing file is depicted in FIGS. 10A and 10B. FIG. 10A shows the image information intended to be printed, comprising a plurality of printing pixels 1201, 1202, 1203, 1204, 1205, 1206, 1207. FIG. 10B shows the vignetted 1-bit printing file with a number of concentric peripheries 1210, 1220, 1230, 1240, 1250, 1260 of additional pixels disposed around each printing pixel in the printing file (labeled only relative to pixel 1201 to reduce clutter). The number of concentric peripheries is preferably greater than the widest distance (in pixels) between highlight screen dots in the printing file. The concentric peripheries overlap and build a solid area (as illustrated in FIG. 10B, bounded by periphery 1260) of pixels surrounding the printing details in the printing file.

Another method of creating such vignettes in a vector-based image file is to increase the thickness/diameter of the pen used to draw the printed objects substantially enough to create objects that build vignettes around the original objects in the file.

The vignettes may be created during ripping the image files or later in a merger application (e.g. the ESKO Merger) before a job is sent to the exposer of the imager (e.g. a CDI Imager).

Image information is often provided by PDF files. PDF files often contain different layers (e.g. for different ink colors). Accordingly, the non-printing image may be contained in a dedicated layer of the PDF file. This image is then ripped by the RIP with the screen of microdots.

Figure 8:
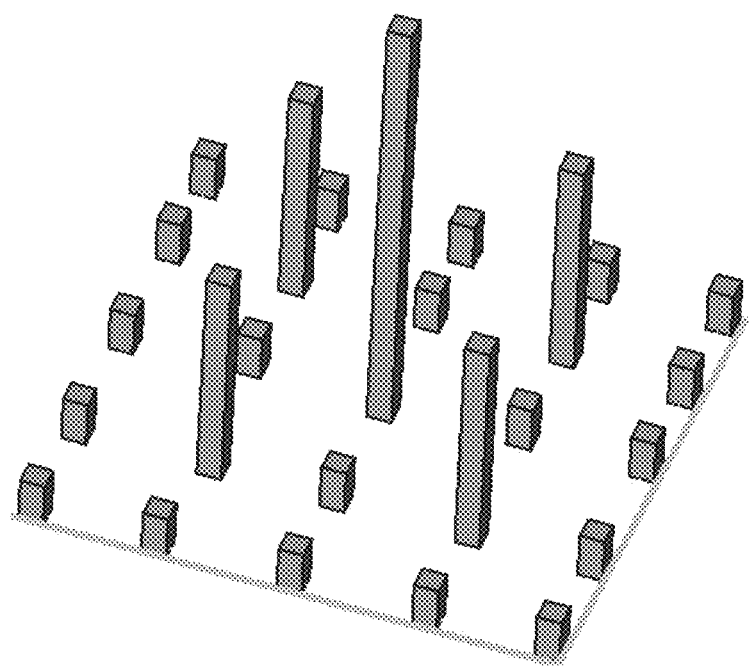
FIG. 8 is a perspective view schematic illustration of an exemplary raster pyramid for microdots created from single microdots.
Figure 9A:
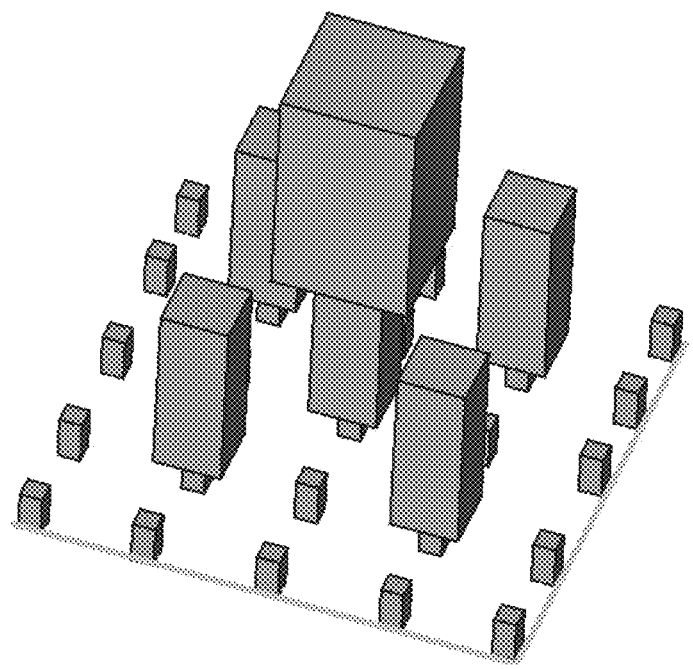
FIG. 9A is a perspective view schematic illustration of an exemplary raster pyramid for microdot structures created from clusters of microdots.

As it is advantageous to create different microdot structures in the mask, the PDF layer for non-printing images may contain gray level information. Different gray levels may be assigned to different microdot sizes or different numbers of microdots per surface unit by using a raster pyramid tile. FIG. 8 schematically illustrates a raster pyramid for microdots created from single dots. FIG. 8 depicts a matrix of pixel locations in the horizontal plane, and different boost levels in the vertical axis. These dots are boosted according to the desired mask opening; hence, the grey level controls the number of dots per surface area and the boost amplitude of the laser power. For simplicity, the pyramid depicted in FIG. 8 shows only three different levels of microdot density. A similar pyramid is illustrated in FIG. 9A depicting conventional imaging of microdots without boosting. FIG. 9A depicts a matrix of pixel locations in the horizontal plane, and different mask opening sizes of non-boosted dots in the vertical axis. Here, also, the grey level controls the number of dots per surface area and the size of the dots. Remarkably, if the imaging and curing system are properly working, the three different gray levels in each of FIGS. 8 and 9 should all lead to a similar amount of plate floor growth for all three sizes of the non-printing structures, because dots formed by greater boosting or a greater number of pixels have a corresponding reduction in the density of mask openings (e.g. dots per surface area). If some aspect of the overall system is not working properly, however, the lowest level areas may have less growth in contrast to the highest level. Thus, use of different grayscale non-printing structures may be used as an indicator of system performance.

Figure 9B:
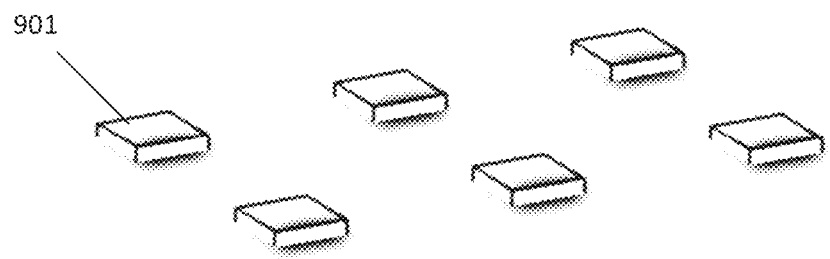
FIG. 9B is a perspective view schematic illustration of an exemplary raster pyramid for a plurality of tiles of microdot structures created from clusters of microdots of a single size.
Figure 9C:
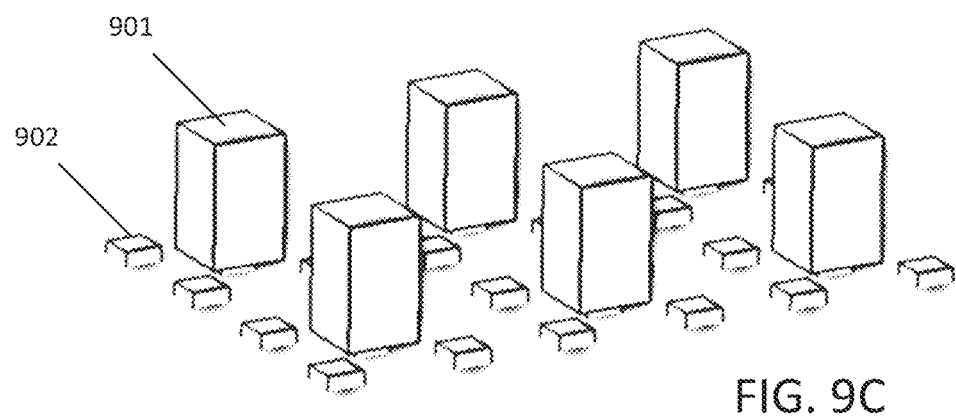
FIG. 9C is a perspective view schematic illustration of an exemplary raster pyramid for a plurality of tiles of microdot structures created from clusters of microdots in a first, relatively larger size and a second, relatively smaller size.
Figure 9D:
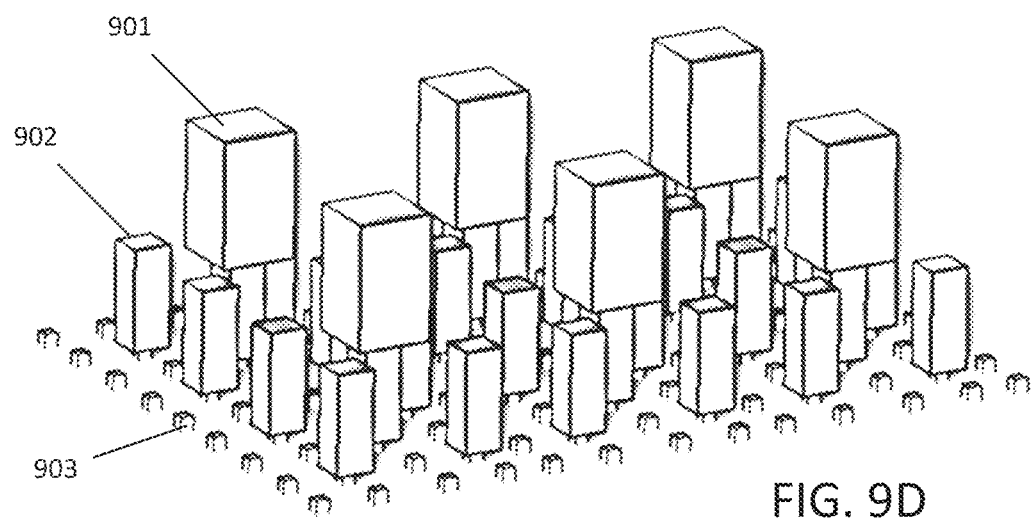
FIG. 9D is a perspective view schematic illustration of an exemplary raster pyramid for a plurality of tiles of microdot structures created from clusters of microdots in a first, relatively larger size; a second, relatively smaller size; and a third, intermediate size.

As further illustration, FIGS. 9B-9D illustrate six tiles at different gray levels. At the level depicted in FIG. 9B, only six (6) mask openings 901, each comprising, e.g., 5×5 pixels, produce respective growth. The level depicted in FIG. 9C comprises structure growth associated with 36 mask openings 902 of 3×3 pixels. The level depicted in FIG. 9D comprises structure growth associated with 117 mask openings 903 of 1 pixel size. Structures 903 associated with 1 pixel mask openings will disappear if, for example, the focus is not set properly, whereas despite such an improper setting, structures 901 associated with mask openings corresponding to the 5×5 pixel clusters will still be produced.

Figure 12:
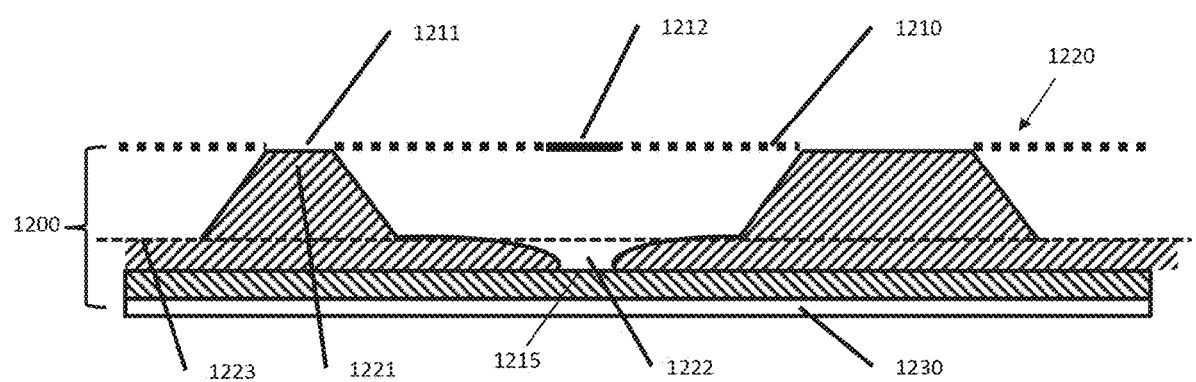
FIG. 12 is a cross-sectional schematic view of a portion of an exemplary printing plate, showing the LAMS layer and mask openings therein for creating printing and non-printing information, wherein the non-printing information is in the form of depressions below the plate floor.

In another embodiment of the invention, indicia may be created in the plate floor as an inverse structure to those previously described, in form of a depression at a predetermined height below the floor, rather than a predetermined elevation above the floor. Referring now to FIG. 12, there is shown a photo curable polymer plate 1200 comprising a LAMs layer 1220 and a backing layer 1230. Hatched portions depicted in FIG. 5 are those portions of the plate that have been cured through the mask openings 1211 and 1210 and the backing layer 1230 and that will stay on the backing layer after LAMs and non-cured portions of polymer have been removed in a washing process. Similar to the plate depicted in FIG. 5, mask openings 1211 produce printing structures 1221 at a printing height of the plate. Plate 1200 also includes indicia formed by depressions 1222 having a lower height than the floor 1223. One exposure process for making such depressions is to create a first subfloor 1215 at a relatively lower height than the desired final floor by using less back exposure energy than is required to create the height of the desired final floor 1223. In a second step, areas of the desired final floor 1223 are formed via the main exposure step using microdot openings 1210 in mask 1220. In locations in which the desired inverse indicia 1222 is located, no mask openings (microdot or printing) are formed in portions 1212 of the mask 1220.

The advantage of using depressions rather than elevations is that it avoids any accidental printing of elevated structures on the floor in locations in which those elevations may interfere with desired highlights in the printing area. In one embodiment, a constant screen of microdots is combined disjunctively with the printing image information to create the normal floor (e.g., pixels already turned "on" based upon image information remain "on," and pixels corresponding to microdots are turned "on" only in locations previously "off"). At places where non-printing indicia in the form of depressions are located, the microdot screen is omitted (and the corresponding pixels remain "off"). In a more elaborated embodiment, microdots may additionally be arranged in concentric circles around certain printing screen dots (e.g. to form non-printing support dots in highlight areas, based on image information), as suggested in EP 1 557 279 B1.

Although described above with respect to an exemplary process of creating plate structures arising from microdots in a LAMS layer, it should be understood that the invention is not limited to use in LAMS-based processes. Any process known in the art for creating a printing plate may be used for creating non-printing indicia as described herein, including but not limited to exposure of photopolymer plates by actinic radiation in any range of wavelengths, including plates created by direct imaging or using masks imaged by any process known in the art.

Test Strips

In many cases, plates are placed on a cutting table for separating different plate patches from another, and in some cases, also to cut off the test strip or any other markings not intended for printing. In a preferred embodiment, reproducing code 214 on the back of the plate identical to code 212 may be performed using a laser, such as, e.g. a 10.6 µm CO2 Laser or a fiber laser emitting in the mid-infrared range (e.g. a 2 µm Thulium laser), such as in a range of wavelengths between 1.8 and 2.5 µm, and in one preferred embodiment, 2.03 µm. The laser, such as coupled to a laser Galvo scanner, removes the positive or negative portions corresponding to the QR-code image, thus providing the binary differences detectable by a reader. Thus, code 212 may first be read in its first location on the top side 202 of plate 200 on the test strip 210 prior to cutting off the test strip 210, then the code may be transferred to a non-printing location in the floor 204 of the plate in a location inside the image region 205 of the plate.

In one embodiment, the test strip and/or the code contains a test pattern that allows plate quality to be checked, such as a check with a confocal microscope, after processing of the plate, to determine if the plate processing was successful such that the plate may be approved for printing.

Another embodiment may comprise two identical test strips 210, one of which (not shown) may be cut off and sent separately from the plate to a proofing service, while the rest of the plate is sent to the printer. In such an embodiment, positive proofing of the test strip may be a prerequisite for the printer to start to print the plate. This method may prevent printing of plates having artifacts, thus saving money associated with failed prints. Identification information for processing the test strip and the printing plate may be established by the code.

In still another embodiment, the process data may be stored in the plate by means of a strip at the side of the plate, the strip containing a pattern of spots, such as, for example, "high" spots having a first elevation (e.g. reaching the plate printing surface), and "low" spots having a second elevation (e.g. below the plate printing surface). In other embodiments, the high spots may have a first relatively lesser distance below the plate printing surface, and the low spots may have a second relatively greater distance below the plate printing surface. The spot sequence represents a digital data "word" comprising sequences of high and low bits, like in a serial data transmission. The data word contains the information to be stored in the plate. Thus, for example, the code may be stretched out along a run length of the plate but having only a very narrow width. The advantage of this type of code, as compared to a standard 2D code such as a bar code or QR code, is that the code only requires a small stripe near the image, which makes it easier to add when not much space free of images is available on the plate. Such a code, in principal, is similar to a very long bar code, but able to carry more information because of its length. For example, the corresponding reader may sense dark/light contrast or distance from the reader due to length of travel of a beam from the reader to the surface of the high or low spots, or may use laser triangulation sensors or computer image evaluation. A preferred reader is configured as a swipe code scanner in which the scanner is stationary while the plate with the code moves along under the scanner. In some embodiments, a mechanical sensor capable of sensing the difference between the relative elevations of high and low spots may read the code as the sensor head moves in accordance with the dot elevation. Another aspect of the invention includes monitoring the status of the workflow by software in a central computer, such as computer 170 depicted in FIG. 1. Each process stage 110, 120, etc. sends information to the central computer after scanning the code from the polymer, such as reporting the time and place of arrival of the plate and the current processing status. Thus, the actual status of a job in the workflow can be determined immediately and exactly from the central computer. Certain plates may thus be identified and located instantly in the company workflow. The central computer 170 is programmed with software capable of processing all this information of different plates from different stages of production, such as for example the ESKO Device Manager. The code or indicia may also be read in-between process steps or after completion of the process steps, such as in a storage area or in a queue awaiting processing.

Mobile Device Readers

In another embodiment, the information stored in the indicia may be scanned and read by application software running on a mobile device, such as a mobile phone or tablet computer. As is known in the art, systems incorporating such mobile devices typically include a first portion of software running on the mobile device, with the mobile device in communication with a server over a communication network, such as a wireless network, wherein a second portion of the software resides on the server and interfaces with the portion on the mobile device. Such a system permits immediate identification of plates anywhere in the workflow, including for example, identifying the location of plates in storage dedicated for reprint jobs. In an exemplary method, such as that depicted in FIG. 2A, reader 220, such as a mobile phone, may scan the code on the plate and then provide process parameter information to an operator, such as on the display 222 of the phone or on the display associated with a user interface corresponding to the process equipment (110, 120, etc.) relating to the current processing step. The operator may then enter the relevant process parameters into the process equipment for the next process step, if that equipment is not in communication with the scanning means to read process parameters automatically.

Device Manager

One aspect of the invention comprises controlling and coordinating the various process steps in a way that the overall process is optimized in time and efficiency. Aspects of the claimed invention include not only providing process parameters to the processing machines (110, 120, etc.) for the various pre-press process stages in the workflow of making a flexo plate, but also providing real-time monitoring of the overall plate manufacturing process using readers 220 communicating the in-process locations of a plurality of plates in accordance with scans. Thus, a central tracking processor or "device manager" 170 may receive updates continuously during all process steps of the workflow and thus may be capable of providing a real-time plot of each plate's current position in the entire plate workflow. As used herein, the term "real-time" is intended to mean providing current information contemporaneously, subject to routine delays inherent in the communication protocols, processor speeds, and display rendering capabilities of the various components of the system. In some implementations, in addition to location information, process quality feedback may also be communicated to the Device Manager 170. The Device Manager 170 may be integrated into, for example, Automation Engine software from Esko, the Applicant of the present invention. Although certain specific workflow steps have been mentioned, it should be understood that the indicia may include information relating to other processing machines or process steps in addition to those described explicitly herein, and may, for example, cover any or all process steps between order intake at least until storage after printing or reprinting, which may be applicable for printers who make their own plates. The process is not limited to any number of steps, however, and thus in some embodiments, the process may cover fewer or more steps.

Exemplary Processes

Figure 3:
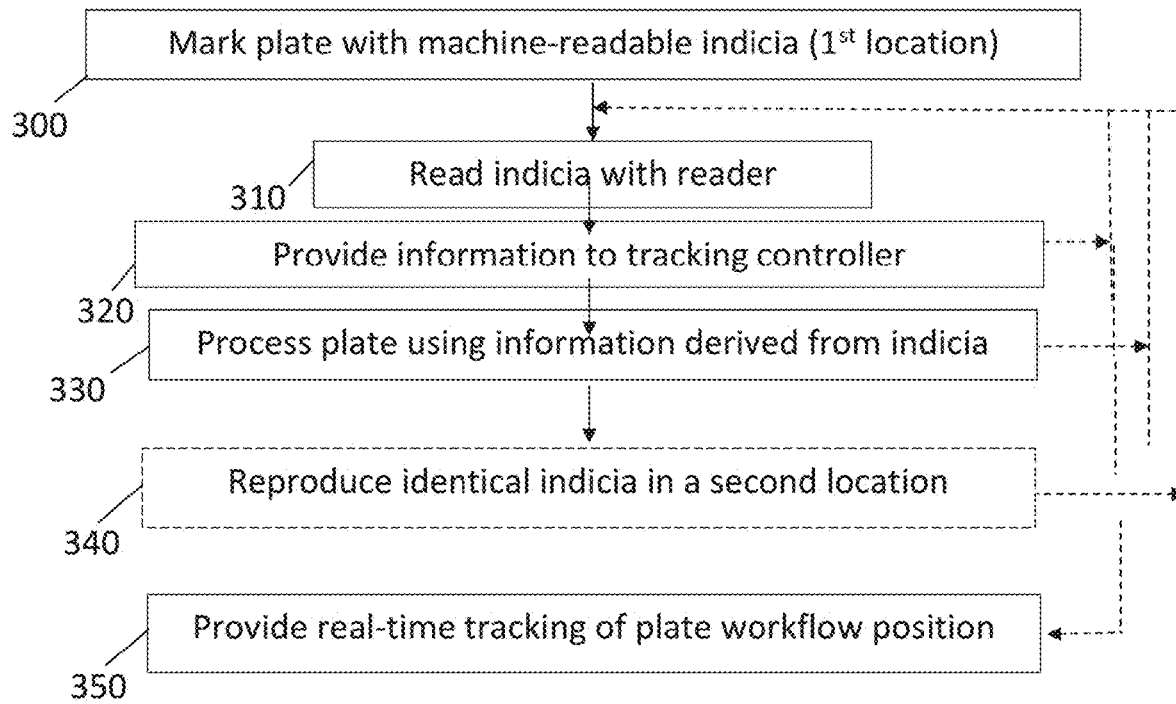
FIG. 3 is a flowchart depicting an exemplary process of the invention.

Thus, one aspect of the invention comprises a process for making a flexo plate. A flowchart corresponding to an exemplary process is depicted in FIG. 3. The process may have a plurality of process steps, such as at least an imaging step, a curing step, a washing step, a cutting step, a printing step, and a storage step, each step performed by a processing machine having at least one variable operating parameter. It should be understood that some processes do not require a cutting step. In some processes, plates are discarded after the printing step and are not stored. Thus, the cutting and storage steps are optional, depending upon the process. Furthermore, it should be understood that not every process step may require instructions for every plate, and thus, some indicia may embody instructions for fewer than all of the process steps. In general, however, at least some embodiments of the invention embody instructions for more than one process step in the workflow. The term "variable operating parameter" means any parameter that may vary depending upon the plate or job, and thus the processing machine requires some input for control of the processing. Step 300 comprises providing machine-readable indicia on the flexo plate. The machine-readable indicia is preferably configured to provide readability downstream of the washing and cutting steps without printing in the printing step. Providing the machine readable indicia comprises embodying in the indicia information including at least a plate identifier and instructions corresponding to the at least one variable operating parameter for each of the processing machines or embodying in the indicia an address in computer storage where such information resides. Step 310 comprises reading the indicia from the flexo plate using a reader in communication with at least a controller of each of the processing equipment configured to perform one of the process steps. Step 320 comprises providing information about the location of the plate in the workflow to a tracking controller. Step 330 comprises processing the plate with the processing machine using the at least one variable operating parameter embodied in the indicia or stored at the address embodied in the indicia. The order of steps 320 and 330 may be reversed. Steps 310-330 may then be repeated for subsequent machines or process steps in the workflow. In some cases, reading the indicia in step 310 and reporting the information to the tracking controller in step 320 may be performed by a reader that is not associated with a processing machine, such as a mobile device, for reporting a location of the plate intermediate of process steps, in storage, or in transit. The process may include in step 350 providing real-time tracking of workflow position for each of the plurality of in-process flexo plates. This step may be practiced at any time during the process after receiving information from the one or more readers in the workflow.

The indicia may be configured to embody quality information indicative of printing properties associated with the plate, in which case "processing" the plate in step 330 may comprise proofing the printing plate by analyzing the quality information embodied in the indicia.

Although the invention is not limited to any particular information or instructions embodied in the machine-readable indicia, each process step may have certain parameters that are particularly well suited for implementation using embodiments of the invention. For example, in a mounting step, the indicia may contain information indicative of the physical position of the plate/slug/patch on a substrate or printing sleeve (e.g., flexo plate left printing lane/middle printing lane/Right printing lane). The indicia may also contain information indicative of the physical coordinates for the mounting cameras of the mounting device. Similarly, in a curing step, such as a UV curing step, the instruction may provide UV exposure parameters, such as exposure time, intensity, and the like. In a "washing" or other non-cured-polymer-removal step, the instructions may comprise processing parameters such as temperature, time, and type (water, solvent, thermal). In a plate-cutting step, the instructions may include the corresponding cut file and cutting parameters, such as type of cutting blade, thickness, and type of the substrate to be cut, and the like. In a quality control step, the instructions may include instructions for loading a specific portion of the plate under process to a device for conducting a quality control (QC) evaluation, along with information for verification relative to information detectable using the device. For example, the evaluation device may be a monitor in which the loaded information is an image of the portion of the plate that can be viewed by the human operator, or the device may be a sensor for measuring plate height or dot shape or size, and the measured value may be automatically compared against a stored value. QC steps may be performed at any point in the workflow. In the printing step, the parameters may include any specialized inks to use, color curves to apply, as well as instructions regarding what location of the printed result should be the subject of a QC evaluations using the onboard machine vision system, such as systems made by AVT, a subsidiary of Danaher Corporation.

Any number of other process parameters may be included instead or in addition, and the invention is not limited to any particular process parameters for any particular process step, nor does each indicia necessary contain information corresponding to each process step. It should be noted that although discussed herein in the context of a single indicia, the amount of data to be stored may exceed what is practical to embed in a single instance of certain types of indicia. Accordingly, multiple indicia may be used, and the information embedded in first indicia may comprise the coordinates for the location of second indicia with instructions for a particular step of interest. As indicated in step 300, the indicia may be initially placed in a first location, in which the process further comprises the optional step 340 of conducting at least one processing step with the indicia in the first location, then reading the indicia with a first reader after that processing step, and reproducing the indicia in a second location prior to the printing step. This optional step may be particularly useful when the first location is, for example, on a test strip that is later cut away in a cutting step, and the second location is in a floor of the plate in an image area of the plate, as described herein.

Although certain aspects of the invention are particularly useful and advantageous in a flexo environment, the disclosure herein is not limited to any particular type of plate or processing.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A finished flexo plate having a plate floor and comprising:
    a plurality of printing dots, each printing dot having an elevation above the plate floor sufficient to transfer ink to a substrate in a printing step using the finished flexo plate;
    non-printing indicia defining a pattern of alphanumeric characters, non-text graphics, or a combination thereof, the non-printing indicia configured for persistent readability relative to the plate floor but having a height relative to the plate floor insufficient to transfer ink to the substrate in the printing step, the non-printing indicia disposed on the plate floor in the form of areas of presence and absence of polymer defined by structures comprising a plurality of microdots on the plate floor, each microdot having an elevation relative to the plate floor lower than a printing height.

2. The finished flexo plate of claim 1, wherein the finished flexo plate is a product of a process of:
    a) providing a plate precursor comprising uncured photopolymer;
    b) imaging the plate precursor by curing portions of the uncured photopolymer by exposing the uncured photopolymer to actinic radiation in locations corresponding to the plurality of printing dots and the plurality of plate microdots; and
    c) removing uncured photopolymer remaining after step (b) from the plate precursor.

3. The finished flexo plate of claim 2, wherein the non-printing indicia is configured to provide persistent readability after removal of the uncured photopolymer in step c).

4. The finished flexo plate of claim 1, wherein the non-printing indicia define a repeating pattern.

5. The finished flexo plate of claim 1, wherein the pattern includes alphanumeric characters embodying information including job number, separation color, version, date, or a combination thereof.

6. The finished flexo plate of claim 1, wherein the non-printing indicia comprises branding information.

7. The finished flexo plate of claim 1, wherein the non-printing indicia comprises at least two different types of microdots.

8. The finished flexo plate of claim 7, wherein at least a portion of the non-printing indicia comprising the at least two different types of microdots defines a visual indicator of a difference in growth between one of the types of microdots as compared to another of the types of microdots during a processing step of the photopolymer plate precursor.

9. The finished flexo plate of claim 8, wherein the difference in growth corresponds to a presence of at least one suboptimal processing condition with respect to at least one processing parameter.

10. The finished flexo plate of claim 9, wherein the at least one suboptimal processing condition relates to a processing parameter selected from the group consisting of: optical focus or cleanness, actinic radiation exposure parameters, and type of manufacturing equipment.

11. The finished flexo plate of claim 8, wherein the visual indicator comprises a detectible difference between some non-printing indicia and other non-printing indicia.

12. The finished flexo plate of claim 11, wherein the detectible difference includes visibility or non-visibility of the respective some and other non-printing indicia.

13. The finished flexo plate of claim 11, wherein the detectible difference includes a difference in an expected height above the finished flexo plate floor.

14. The finished flexo plate of claim 13, comprising a first plurality of structures comprising microdots formed from different numbers of pixels, including at least one non-printing microdot formed from a number of pixels expected to form non-printing indicia under optimal processing conditions and at least one printing microdot formed from a number of pixels expected to form printing indicia under optimal processing conditions, wherein the expected height above the finished flexo plate floor is a printing height.

15. The finished flexo plate of claim 11, comprising at least a first structure comprising microdots defined by a first, relatively greater number of pixels and a second structure comprising microdots defined by a second, relatively lesser number of pixels, wherein visibility of the first structure and the second structure is an indicator of processing under optimal processing conditions, and invisibility of at least one of the first structure or the second structure relative to the finished plate floor is an indicator of processing under suboptimal processing conditions.

16. The finished flexo plate of claim 2, comprising at least two different types of microdots arranged to form one or more test structures comprising a mixture of first microdots designed to form printing dots after the uncured photopolymer removal step under optimal processing conditions and second microdots designed to form non-printing indicia after the uncured photopolymer removal step under optimal processing conditions.

17. The finished flexo plate of claim 16, wherein the one or more test structures embodies a set of rings or blocks, wherein a first subset of the rings or blocks comprise first microdots and a second subset of the rings or blocks comprise second microdots, where a different than expected pattern of non-printing rings or non-printing blocks in the test structures of the finished flexo plate is an indicator of suboptimal processing conditions during the process of forming the finished flexo plate from the plate precursor.

18. The finished flexo plate of claim 1, wherein the non-printing indicia comprises a line for use in alignment of the finished flexo plate.

19. The finished flexo plate of claim 18, wherein the line is positioned on the plate to align parallel to the intended running direction of the finished flexo printing plate in a printing press.

20. The finished flexo plate of claim 1, wherein the plurality of microdots comprises a plurality of clusters of microdots.

21. The finished flexo plate of claim 1, wherein the non-printing indicia define one or more depressions relative to the plate floor, wherein the plurality of microdots define the plate floor and an absence of the plurality of microdots defines the one or more depressions.

* * * * *